(12) United States Patent
Orfanoudakis et al.

(10) Patent No.: US 11,289,908 B2
(45) Date of Patent: Mar. 29, 2022

(54) SOGI-BASED PLL FOR GRID CONNECTION AND MOTOR CONTROL

(71) Applicants: MAGNETIC PUMPING SOLUTIONS, LLC, Houston, TX (US); MAGNETIC PUMPING SOLUTIONS LIMITED, Eynsham (GB)

(72) Inventors: Georgios Orfanoudakis, Heraklion (GR); Michael Yuratich, Hampshire (GB)

( * ) Notice: Subject to any disclaimer, the term of this patent is extended or adjusted under 35 U.S.C. 154(b) by 235 days.

(21) Appl. No.: 16/488,359

(22) PCT Filed: Feb. 28, 2018

(86) PCT No.: PCT/US2018/019924
§ 371 (c)(1),
(2) Date: Aug. 23, 2019

(87) PCT Pub. No.: WO2018/157120
PCT Pub. Date: Aug. 30, 2018

(65) Prior Publication Data
US 2019/0379205 A1    Dec. 12, 2019

Related U.S. Application Data

(60) Provisional application No. 62/464,101, filed on Feb. 27, 2017.

(51) Int. Cl.
*H02J 3/01* (2006.01)
*G05F 1/70* (2006.01)
*G01R 19/25* (2006.01)
*G01R 23/02* (2006.01)
*H02J 3/38* (2006.01)
*H03L 7/08* (2006.01)
*H02J 3/44* (2006.01)

(52) U.S. Cl.
CPC .................. *H02J 3/01* (2013.01); *G05F 1/70* (2013.01); *G01R 19/25* (2013.01); *G01R 23/02* (2013.01); *H02J 3/381* (2013.01); *H02J 3/44* (2013.01); *H03L 7/08* (2013.01)

(58) Field of Classification Search
CPC ..... H02J 3/01; H02J 3/381; H02J 3/44; G05F 1/70; G01R 19/25; G01R 23/02; G01R 25/00; H03L 7/08; H02M 7/493; H02M 1/084
USPC ......................................................... 307/105
See application file for complete search history.

(56) References Cited

U.S. PATENT DOCUMENTS

| | | | |
|---|---|---|---|
| 4,745,512 A | 5/1988 | Hampson | |
| 5,359,275 A | 10/1994 | Edwards | |
| 6,583,996 B2 | 6/2003 | Deng et al. | |
| 2010/0213925 A1 | 8/2010 | Teodorescu et al. | |

(Continued)

*Primary Examiner* — Danny Nguyen
(74) *Attorney, Agent, or Firm* — Matthew J Patterson

(57) ABSTRACT

SOGI based apparatus and methods for providing balanced three phase output signals free of harmonics, DC components and imbalance present in the input signals, are disclosed. In addition, such apparatus and methods for providing corresponding output signals which are drift-free integrals of the input signals and which signals may enable the control of a power electronics inverter for improved and robust grid power injection and for motor control are disclosed.

21 Claims, 21 Drawing Sheets

(56) References Cited

U.S. PATENT DOCUMENTS

2011/0134669 A1   6/2011   Yuzurihara et al.
2017/0097380 A1*  4/2017   Pahlevaninezhad .... H02J 3/381

* cited by examiner

Fig. 32C

Produce a reference voltage from the positive-sequence voltage component signal and the negative-sequence voltage component signal.
3246

FIG. 32D

SOGI-BASED PLL FOR GRID CONNECTION AND MOTOR CONTROL

CROSS REFERENCE TO RELATED APPLICATIONS

This application claims the benefit of U.S. Provisional Patent Application Ser. No. 62/463,255 filed 27 Feb. 2017 as well as Patent Cooperation Treaty Patent Application Serial No PCT/US2018/019924 filed 27 Feb. 2018. The disclosure of the applications above are incorporated herein by reference in their entirety.

BACKGROUND OF THE INVENTION

Field of the Invention

Embodiments of the disclosure generally relate to adaptive filters, integrators, phase locked loops (PLLs), and current controller structures based on the second-order generalized integrators (SOGIs), and their application to grid-connected inverters and motor drives.

Description of the Related Art

Adaptive Filters, Integrators and PLLs

There are Many Industrial Applications where Power is Generated into the Grid and supplied to a motor. In order to accomplish this, the power electronics equipment (and related instrumentation and protection relays) require dependable measurements of frequency and phase. For the grid, this is the frequency and phase angle of the polyphase supply voltages. The grid may be a national utility supply and/or one or more generators acting in concert. For motors, this is the electrical frequency associated with shaft rotation and the instantaneous shaft angle (position of the rotor poles) modulo one pole pair angle. In a synchronous motor, such as a permanent magnet motor, the poles are fixed in the rotor. In an asynchronous motor, such as the ubiquitous induction motor, the poles are induced on the rotor.

In some cases, it is possible to affix a shaft position sensor to a motor such as an opto-mechanical encoder or electromechanical resolver. However, in a large number of cost-sensitive applications, and in applications where the motor is physically inaccessible (as in a submersible pump motor deployed deep in an oil well) it is required to operate motors without a shaft sensor. In a grid application there is no physical equivalent to a shaft encoder. Thus, where no sensor is used, a sensorless technique must be used, in which frequency and phase is estimated from readily measured terminal voltages and currents. Motors pose a particular problem in that unlike a 50 Hz or 60 Hz grid, the frequency (speed) range of the motors can be very wide.

A further problem of imbalance arises in grid distribution and motor control. A typical grid distribution supply is comprised of three phases, plus a neutral. Consumers are connected to a single phase and neutral. Different consumers are supplied from different phases. When these consumers absorb different levels of power, the network impedances result in voltage differences appearing between phases. Moreover, network equipment such as transformers and industrial loads such as high power motor drives cause voltage harmonic distortion. These imbalances and distortions cause excess power losses in network infrastructure and this is an increasingly severe issue. In some cases, the power utility needs to over-size and upgrade the network infrastructure to cope with these issues. A specific goal of a grid-connected generation device, such as wind turbines, solar panels and other generation equipment, which can be distributed over a wide area, is to inject high quality balanced sinusoidal currents into the grid. Doing so improves the quality of power flowing in the network, reducing imbalance, distortion and power losses.

In the case of motors, it is well known that only a 5% voltage imbalance can cause excess power loss due to the resulting imbalanced currents, leading to inefficiency, overheating and unwanted torque ripple and vibration. This results in the need to de-rate the output of the motor in some cases by 25%. In certain applications, such as submersible motors deployed deep in oil wells, long cables and sometimes intermediate transformers are used. These cables, especially flat steel-armored types, have very substantial imbalanced mutual inductances between the conductors, which manifests itself as unequal impedances on the phases. Even round cable, being in proximity to steel tubing for its entire length, exhibits imbalance. In these cases, a balanced supply voltage such as almost invariably supplied by power electronic variable drives will result in imbalanced currents. In turn, the sensorless estimation referred to hereinbefore becomes more difficult.

Most sensorless motor control schemes use an observer (also known as an estimator) to estimate the rotor angle and speed, which is required for motor control. Observers typically combine measured voltages and currents with some information for the motor (e.g. winding resistances, inductances) and a type of Phase-Locked Loop (PLL). Similarly, grid-connected inverters require PLLs to obtain the angle and frequency of the grid voltage.

Desirable PLL characteristics include the ability to obtain fast and accurate synchronization information (i.e. angle and speed) and insensitivity to disturbances, harmonics, DC components, unbalances, sags/swells, notches and other types of distortion in the input signal. PLLs are used in several applications, including telecommunications, grid-connected inverter synchronization, motor control, and others. For three-phase motor control in particular, the signals fed to the PLL are (approximately) three-phase sinusoidal signals, derived from measurements and equations that depend on the motor type (e.g. induction, synchronous) and model. The derivation of these signals typically requires integration of voltages, to produce respective fluxes.

This integration, presents its own challenges, mainly relating to the DC components that can be present in the input signals. Such DC components can appear either in the actual measured quantities, or due to offsets in the values provided by the relative sensors (due to inaccuracies in their calibration). The presence of DC (or very low-frequency) components in the input signals is known to cause problems to the integrators (e.g. drift, saturation). Integrators, either analog or digital, therefore need to be supplemented with DC blocking mechanisms, typically high-pass filters (HPFs), to avoid these effects. However, HPFs can limit the operational range and dynamics of the integrator, and can require compensation for the magnitude and phase error they introduce. In addition, integrator drift is a known problem in simple implementations of induction motor vector control. It should be noted that the use of conventional integrators in conjunction with an observer leads to instability. Induction motors have the great merit that they are self-controlling so long as the applied voltage V is in suitable proportion to the applied frequency f. The use of ratio V/f is commonly called scalar control. In fact, the drive is no more than a variable frequency voltage generator, maintaining the set ratio of V to f, whose approximate value can be calculated from the rated voltage and frequency on the motor nameplate. These drives produce a balanced voltage, however, on imbalanced systems such as those with long cables, the motor currents will not be balanced and the motor temperature will rise.

It is important to note, that with respect to the various figures present herein, that there are many equivalent conventions in the art for representing signal processing structures. For example, integration is commonly represented by a block labelled with an integration symbol. Equivalently, the label is sometimes the Laplace operator equivalent, 1/s. Gain blocks can be represented by a triangle or block labelled with the gain. The figures herein use a mixture of such styles but the meaning should be clear to one skilled in the art.

Referring to FIG. 1, the structure of a prior art second-order generalized integrator (SOGI) 10 is shown, together with its use for the generation of a set of direct 11 and quadrature signals, such as voltages, from the input v 13, output v' 11 and qv' 12, respectively [1]. The whole structure can be referred to as a SOGI-QSG (quadrature signal generator). In this figure, the output v' 11 is subtracted from the input v 13 to produce a negative feedback error signal 14, which is amplified by proportional gain k 15. A second error term is formed from this by subtracting output qv' 12. This is amplified by gain ω' 16, and integrated to form the output v' 11. In turn, output v' 11 is used as the input to integrator 17 and further gain ω' 16 to form qv' 12. It will be apparent to one practiced in the art that simple transformations such as transposing the order of gain and integration can be made without affecting the overall transfer function.

The direct and quadrature outputs of the SOGI-QSG described herein above have the following second order transfer functions:

$$D(s) = \frac{v'}{v}(s) = \frac{k\omega's}{s^2 + k\omega's + \omega'^2} \quad \text{Equation 1}$$

$$Q(s) = \frac{qv'}{v}(s) = \frac{k\omega'^2}{s^2 + k\omega's + \omega'^2} \quad \text{Equation 2}$$

Utilizing Equations 1 and 2 the Bode plots of D(j ω) 21, 22 and Q(j ω) 23, 24 are shown in FIG. 2 illustrating the frequency response of a typical prior art SOGI based system. The Bode magnitude plot 25, expresses the magnitude of the frequency response in decibels, and the Bode phase plot 26, expresses the phase shift. In Equations 1 and 2 gain ω' is the numerical representation of the motor or grid electrical angular frequency that is desired and, as hereinafter shown, can be found by various known methods. The x-axes of Bode plots 25, 26 represent frequencies that might be found in the input signal v 13, such as ω' itself, and frequency fluctuations that can occur. It can be seen in the figure that direct output 22 does not introduce a phase shift relative to the component of interest of the input signal v 13 (components such as harmonics, for example), which is at frequency ω' and the direct output 21 acts as a first-order band-pass filter around this frequency (a −20 dB/decade roll-off 1/ω). It should also be apparent that the quadrature output 24 introduces a 90-degree phase shift relative to direct output 22 and acts as a second-order low-pass filter above this frequency (−40 dB/decade roll-off 1/ω²). It should be known by those skilled in the art that quadrature output 12 is not the integral of the input; it is the input v 13 shifted in phase by 90 degrees and passed through an equivalent of a low-pass filter. Moreover, what should be apparent is that the SOGI of the prior art has inability to attenuate the quadrature output at low frequencies. The practical impact of this deficiency will be described in more detail hereinbelow.

The direct output 11 of a SOGI-QSG 10 can be used as a band-pass filter, for instance, to suppress the distorting components of a sinusoidal signal with angular frequency ω'. It is important to note that ω' can vary, and can be supplied to SOGI-QSG 10 from an observer (not shown) such as a well known synchronous reference frame (SRF) or other phase lock loop (PLL), or a Frequency-Locked Loop (FLL). In this way, the SOGI-QSG(s) 10 and the observer can act cooperatively to clean the input signal v 13 from distorting low- and high-frequency components. The observer then works with the cleaned signals, thus providing more stable and accurate speed estimation (in the case of motor control) to the SOGI-QSG(s), and to the user.

Referring to FIGS. 3 and 4, a single-phase 30 SOGI-based PLL and a three-phase 40 SOGI-based PLL of the prior art are shown. With specific reference to FIG. 4, the three phases are denoted by subscripts a, b and c, ω' is the estimated frequency and θ is the estimated rotor angle. In the various figures, and as commonly referred to in the art, the coupled SOGI-type PLL structure can sometimes be abbreviated to PLL, such as when discussing the use of frequency and angle outputs.

Referring to FIG. 5, as is very well known in the art, a three-phase system can be represented by an equivalent two-phase system 50. In this particular embodiment, the three-phase SOGI-based PLL is replaced by two SOGI-QSGs 51, 52, by implementing the αβ (Clarke) transformation 53 [1]. In this embodiment, the three phase input signals $v_a$, $v_b$ and $v_c$ are stored in a vector $V_{abc}$ 54 and transformed to two phases using matrix abc-αβ 53. The use of SOGIs 51, 52 in an αβ configuration, is commonly known in the art as a double SOGI quadrature signal generator "DSOGI-QSG" or simply "DSOGI", as shown with reference to FIG. 6 below. It should be noted that the term "DSOGI" will be also used in this disclosure to denote DSOGI-type structures, which can be based on different building blocks, other than SOGI-QSGs, as will be more fully described herein after. This implementation makes use of the quadrature output of the SOGI-QSGs as well. The additional advantage of such an implementation is that it can identify and filter an imbalance present between the three phases, i.e. in case of imbalanced (asymmetrical) input signals. It should be appreciated by those skilled in the art that an imbalanced three-phase system can be considered as the sum of two balanced systems, in which the 120-degree separation between each of the three phases is sequenced first in a normal reference order, called the positive-sequence, and second in a reverse order called the negative-sequence. The imbalance filtering is known to be achieved by the calculation of the positive-sequence component of the three input signals 55, 56, 57, performed within positive-sequence component (PSC) block 58.

Referring to FIG. 6, the two-phase system 50 shown above in FIG. 5 is shown with an observer 61, wherein the observer is shown by example to comprise a SRF-PLL. It should be noted that other types of PLL can be used instead of the SRF PLL.

Current Control of Imbalanced Loads

It is known that PLL immunity to imbalances is essential for the control of imbalanced loads, since a current controller cannot operate properly on the basis of distorted angle-speed estimates. However, a PLL on its own is not a complete solution to the current control problem, as the current controller may not be able to handle imbalanced loads (i.e. produce balanced currents), even when operating with accurate angle-speed estimates. What is needed is a controller that can generate balanced output currents when its load is imbalanced.

It is well known in the art that imbalance in 3-phase waveforms is equivalent to the existence of a negative-sequence component as set forth in commonly known symmetrical components theory. With respect to current control, it is also known that the basic synchronous reference frame (dq) current controller, comprising two proportional integrated (referred to herein after as PI) controllers (for the d and q components of the current, respectively) can only control the positive-sequence component of the currents. The negative-sequence current component can only be controlled by extracting it from the three-phase currents and adding one more set of dq PI controllers to suppress it. The addition of one more set of dq PI controllers on the negative-sequence currents, is known in the art and comprises what is known as a double synchronous reference frame (referred to herein after as DSRF) current controller [6]. The most difficult portion of implementing a DSRF current controller is the extraction of the symmetrical components of the currents. This step is important in order to avoid the undesirable double-frequency oscillations that appear on all four dq quantities if the positive and negative-sequence controllers are fed with the actual, imbalanced 3-phase currents. The desired method is that the positive-sequence current controller is fed with the positive-sequence component of the currents only (which are balanced, by definition), and the negative-sequence current controller is fed with the negative-sequence component of the currents only (which are balanced, as well). This desired method achieves a decoupling of the positive and negative-sequence controllers, and enhances the overall performance of current control. The resulting current controllers are known and commonly referred to as double decoupled synchronous reference frame (referred to herein after as DDSRF) current controllers.

Different techniques have been proposed in the art to achieve this decoupling [7]. In principle, any method that implements some form of symmetrical components derivation could be used for this purpose (for example, see [8]). One such technique makes use of a DSOGI structure 70 shown in FIG. 7. The positive and negative-sequence components of the input signal, denoted by superscripts "+" and "−", respectively, can be derived by a positive-negative-sequence calculator 71 (referred to herein after as PNSC) from the DSOGI [9].

For at least the reasons stated herein before, it is desirable to be able to provide a simplified control circuit that can provide filtering and current balance. There is clearly a need for an improved means of such control circuits for injecting suitable power into the grid as well as balancing three-phase power in the control of motors.

SUMMARY OF THE INVENTION

It disclosed that the SOGI based systems of the present disclosure provide balanced three phase output signals free of harmonics, DC components and imbalance present in the input signals. It is a further aspect to provide corresponding output signals which are drift-free integrals of the input signals. It is further disclosed that such systems provide signals that will enable the control of a power electronics inverter for improved and robust grid power injection and for motor control.

Such systems used in electrical applications comprise a second-order generalized integrator (SOGI) based adaptive filter adapted to receive input signals, to generate information about the input signals and to output filtered signals based on the information. In certain embodiments the second-order generalized integrator based adaptive filter comprises a modified second-order generalized integrator (mSOGI) adapted to suppress low frequency components of the input signals and can further comprise a dual quadrature signal generator (SOGI-2QSG) adapted to output a direct component signal, a quadrature component signal, an integrated direct component signal and an integrated quadrature component signal of the input signal and is further adapted to output filtered signals based thereon.

Systems of the present disclosure include input signals comprising a multiphase signal (abc) and a predetermined angular frequency ($\omega'$) and a transformation processor adapted to transform the multiphase signal (abc) into an $\alpha$ signal and a $\beta$ signal and include a first second-order generalized integrator adapted to receive the predetermined angular frequency and to receive and filter the $\alpha$ signal and to produce a direct filtered $\alpha$ signal and a quadrature filtered $\alpha$ signal and a second second-order generalized integrator adapted to receive the predetermined angular frequency and to receive and filter the $\beta$ signal and to produce a direct filtered $\beta$ signal and a quadrature filtered $\beta$ signal and a first calculator adapted to receive the direct filtered $\alpha$ signal and the quadrature filtered $\beta$ signal and to produce a positive-sequence $\alpha$ component signal and a second calculator adapted to receive the direct filtered $\beta$ signal and the quadrature filtered $\alpha$ signal and to produce a positive-sequence $\beta$ component signal and a second transformation processor adapted to transform the positive-sequence $\alpha$ component signal and the positive-sequence $\beta$ component signal into a clean multiphase positive-sequence output signal.

Some systems of the present disclosure further include a second summing calculator adapted to receive the direct filtered $\alpha$ signal and the quadrature filtered $\beta$ signal and to produce a negative-sequence $\alpha$ component signal and a second differencing calculator adapted to receive the direct filtered $\beta$ signal and the quadrature filtered $\alpha$ signal and to produce a negative-sequence $\beta$ component signal and a third transformation processor adapted to transform the negative-sequence $\alpha$ component signal and the negative-sequence $\beta$ component signal into a negative-sequence current signal to output a negative-sequence current signal as part of the clean multiphase negative-sequence output to attenuate imbalances, ripples, harmonics and DC components present in the input signal.

Still other systems of the present disclosure include those where the input signals are a three component phase voltage signal and a three component reactive phase flux drop signal and include a first pair of second-order generalized integrators adapted to receive an estimated frequency signal and to receive, integrate and filter the three component phase voltage signal and to output a filtered flux signal and a second pair of second-order generalized integrators adapted to receive an estimated frequency signal and to receive and filter the three component reactive phase flux drop signal and to output a filtered reactive phase flux drop signal and a calculator to produce a difference between the filtered flux signal and the filtered reactive phase flux drop signal and to output an estimated rotor flux signal and an observer to receive the estimated rotor flux signal and to output an estimated rotor angle and the estimated frequency signal.

Still other systems of the present disclosure produce negative-sequence components of the signals used to remove imbalances between the phases of the multiphase input signals.

Methods for filtering input signals in accordance with the present disclosure include at least one of suppressing low frequency components of the input signals and producing a direct component signal, a quadrature component signal, an integrated direct component signal and an integrated quadrature component signal of the input signals and outputting filtered signals based thereon.

Other methods for filtering input signals in accordance with the present disclosure where the input signals comprise a multiphase signal and a predetermined angular frequency include transforming the multiphase signal into an $\alpha$ signal and a $\beta$ signal and filtering the $\alpha$ signal and producing a direct filtered $\alpha$ signal and a quadrature filtered $\alpha$ signal filtering the $\beta$ signal and producing a direct filtered $\beta$ signal and a quadrature filtered $\beta$ signal and producing a negative-sequence $\alpha$ component signal and producing a negative-sequence $\beta$ component signal and transforming the negative-sequence $\alpha$ component signal and the negative-sequence $\beta$ component signal into a clean multiphase negative-sequence output signal.

Still other methods include using a phase locked loop to receive a three component phase voltage signal and a three component current signal and outputting an estimated angle and the estimated frequency signal and differencing the respective negative-sequence current component from the three component current signal and outputting a differenced negative-sequence current component signal and using an i-iNeg controller to produce a positive-sequence voltage component signal and using an iNeg controller to produce a negative-sequence voltage component signal and producing a reference voltage from the positive-sequence voltage component signal and the negative-sequence voltage component signal.

Methods of the present disclosure further include reducing an imbalance between phases of a multiphase electrical signal by producing a negative-sequence current component signal iNeg from the multiphase electrical signal using an estimated angle and a predetermined frequency and subtracting the negative-sequence current component signal from a current signal of the multiphase electrical signal to produce an i-iNeg component signal and producing a positive-sequence voltage component signal using the i-iNeg component signal and the estimated angle and producing a negative-sequence voltage component signal using the negative-sequence current component signal iNeg and the estimated angle and adding the positive-sequence voltage component signal and the negative-sequence voltage component signal to produce a multiphase reference voltage signal which will be used to achieve current balancing.

The systems disclosed use input signals that can include imbalances, ripples, harmonics or dc components and attenuate at least one of the imbalances, ripples, harmonics or dc components to produce a clean multiphase output signal.

BRIEF DESCRIPTION OF THE DRAWINGS

So that the manner in which the above-recited features of the present disclosure can be understood in detail, a more particular description of the disclosure, briefly summarized above, can be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

In the following detailed description of the embodiments, reference is made to the accompanying drawings, which form a part hereof, and within which are shown by way of illustration specific embodiments by which the examples described herein can be practiced. It is to be understood that other embodiments can be utilized and structural changes can be made without departing from the scope of the disclosure.

The problems in the prior art discussed hereinbefore are addressed by using systematic electrical method and apparatus of the present disclosure. For instance, quadrature output of the prior art SOGI-OSGs does not offer any filtering on low-frequency components. Thus, DC components of the input signals (which can particularly appear due to calibration errors in measured signals) will pass to the quadrature outputs without any attenuation. This is a known problem in the use of prior art SOGI-OSGs [2]-[4]. Low speed motor operation poses similar problems.

Figure 1:
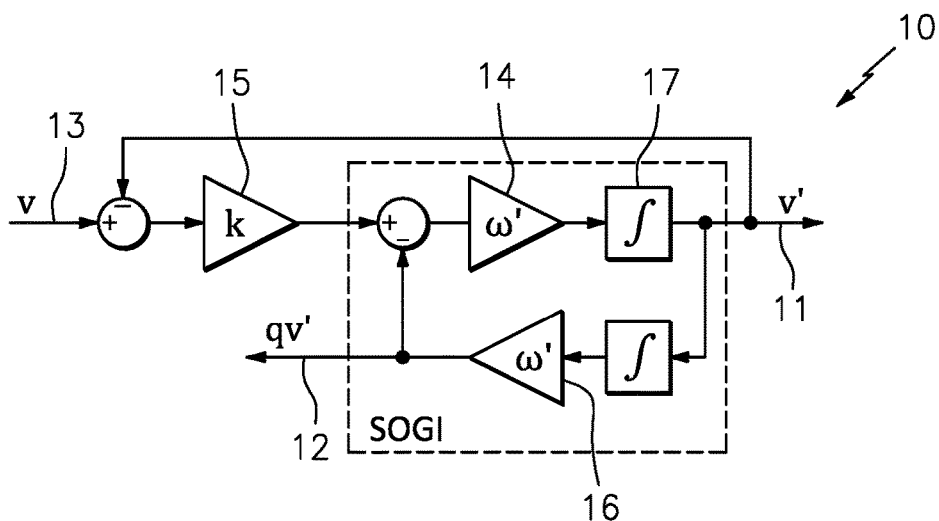
FIG. 1 is a schematic diagram of a second-order generalized integrator of the prior art.
Figure 2:
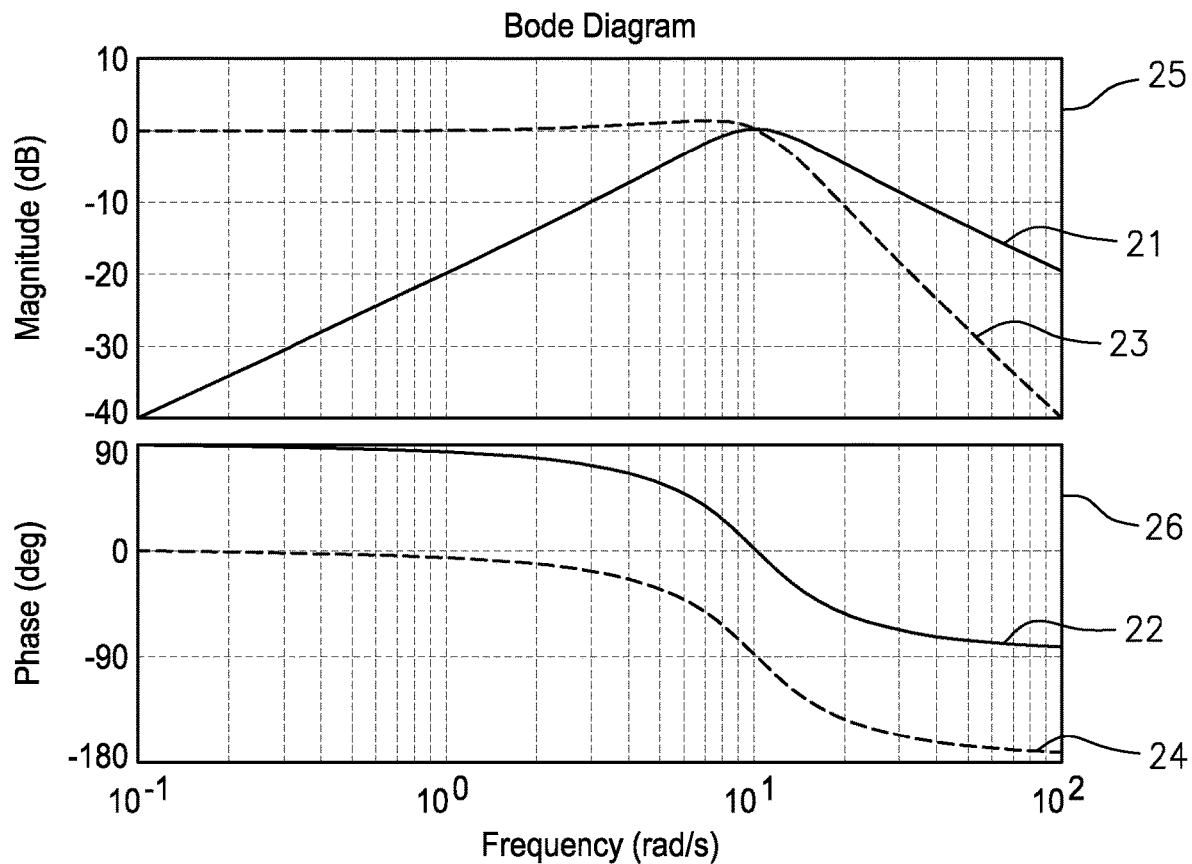
FIG. 2 is a graphical representation of the frequency response of a second-order generalized integrator of the prior art.
Figure 3:
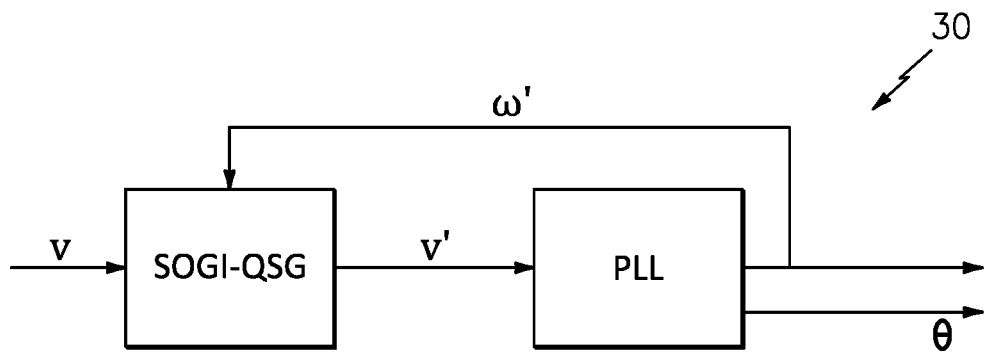
FIG. 3 is a schematic diagram of a single phase second-order generalized integrator and phase locked loop controller of the prior art.
Figure 4:
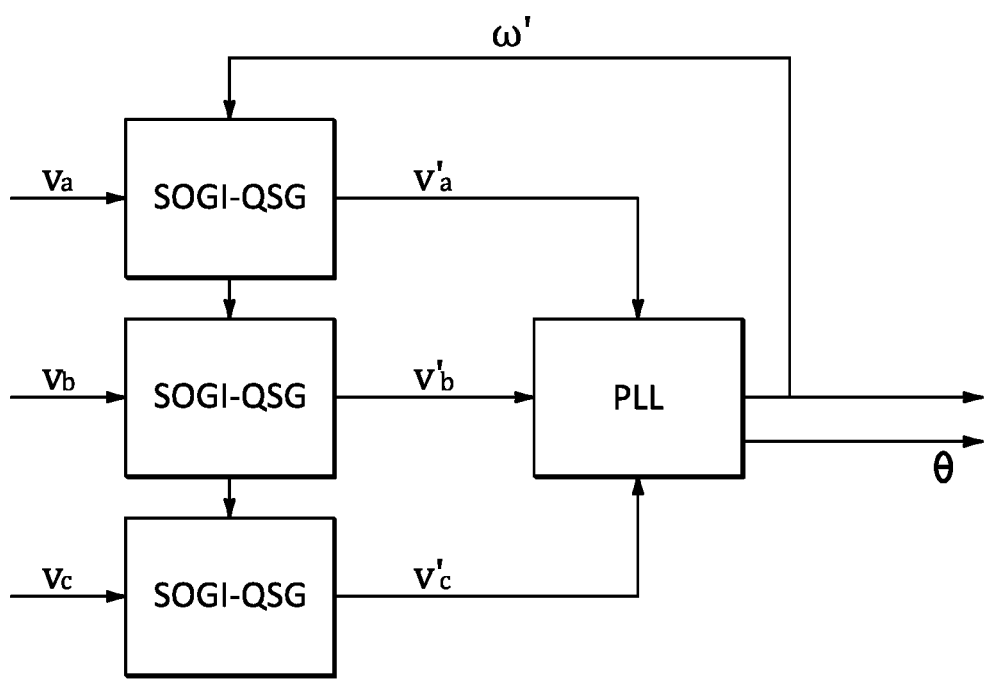
FIG. 4 is a schematic diagram of a three phase second-order generalized integrator and phase locked loop controller of the prior art.
Figure 5:
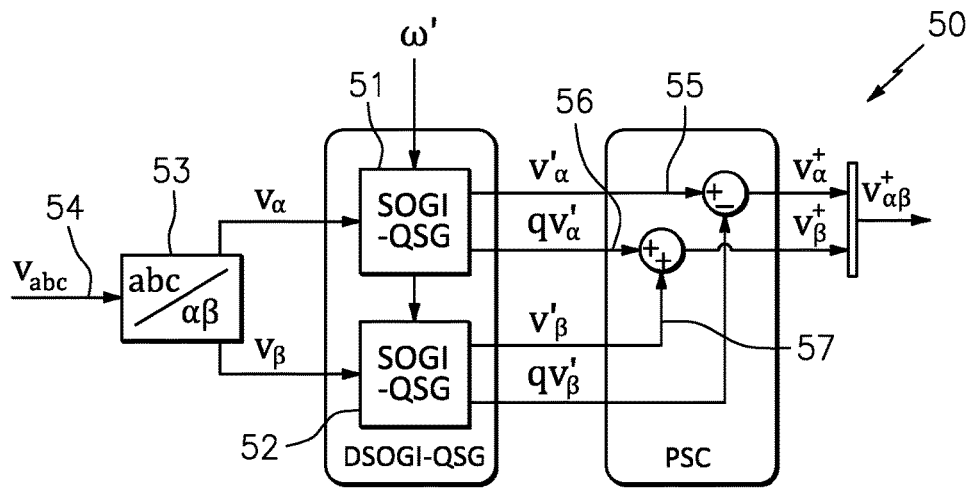
FIG. 5 is a schematic diagram of a three phase double second-order generalized integrator controller of the prior art.
Figure 6:
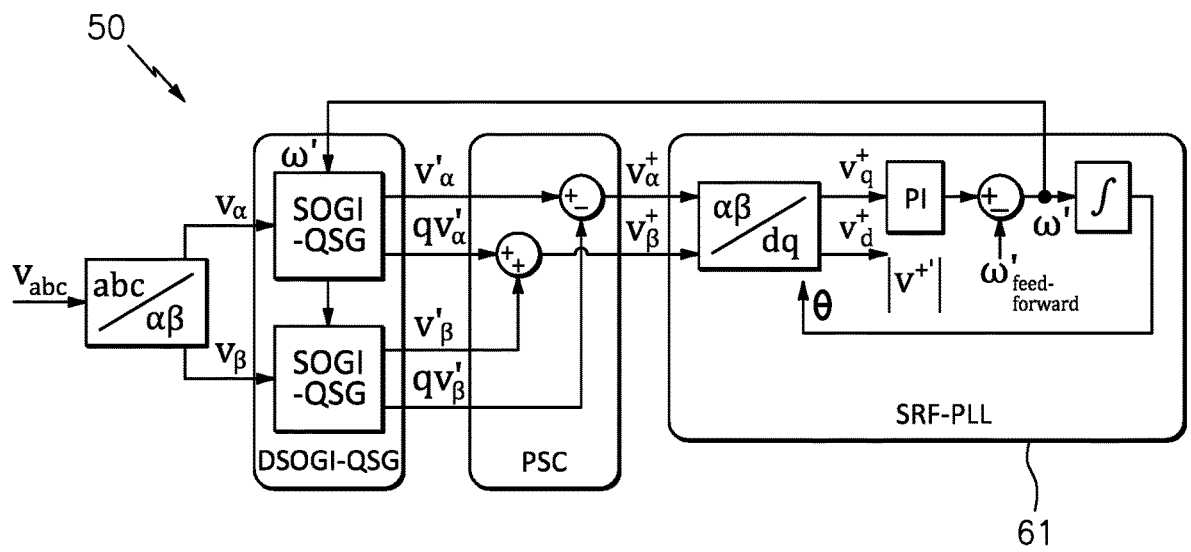
FIG. 6 is a schematic diagram of a three phase double second-order generalized integrator and observer of the prior art.
Figure 8:
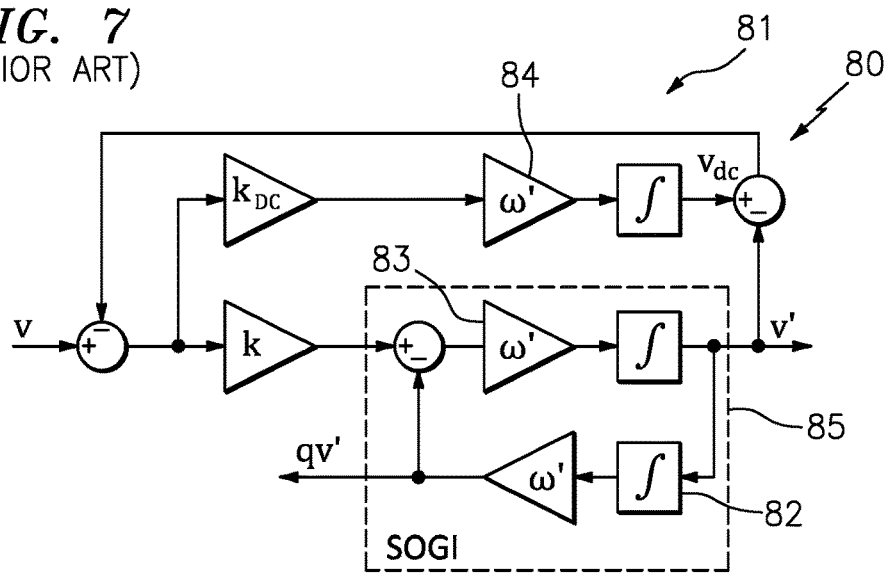
FIG. 8 is a schematic diagram of a SOGI including a low frequency suppression circuit of the prior art.
Figure 10:
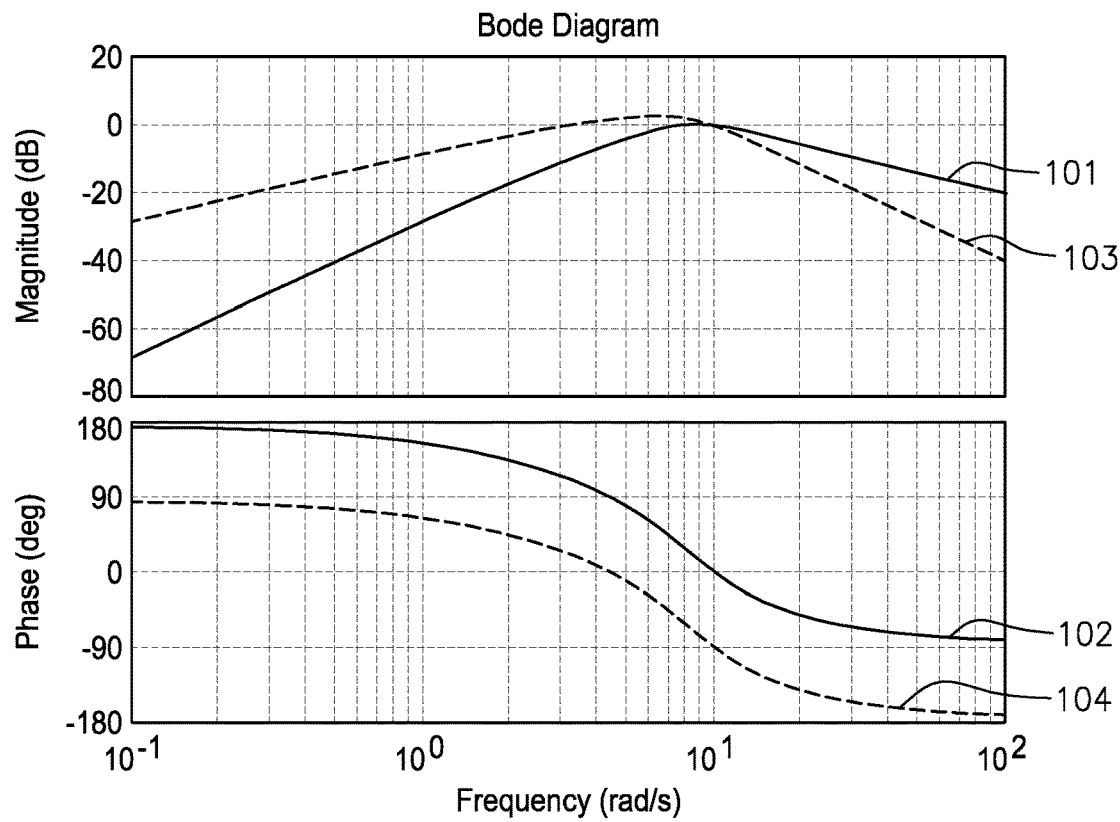
FIG. 10 is a graphical representation of the frequency response of a dcSOGI of the prior art.

Referring to FIG. 8, there is shown an embodiment of a SOGI type structure of the prior art, referred to herein as the dcSOGI 80, which adds a DC offset controller 81 [2], [3] to SOGI 85. dcSOGI 80 includes gain blocks 82, 83, 84 set at the desired frequency ω' as described herein above. The Bode plot for the dcSOGI 80 (FIG. 8) is shown in FIG. 10 for ω' equal to 10 rad/s, wherein the direct outputs 101, 102 and quadrature outputs 103, 104 can be compared with the direct outputs 21, 22 and quadrature outputs 23, 24 of the SOGI shown in FIG. 2. It can be seen that the dcSOGI 80 retains high-frequency attenuation for direct output 102 and quadrature output 104, and adds low-frequency attenuation to the quadrature output 104, which as noted above, is not provided by the SOGI 10 of FIG. 1. Thus, dcSOGI 80 is an example of a SOGI structure that provides low frequency and DC suppression for both its direct and quadrature outputs.

Figure 9:
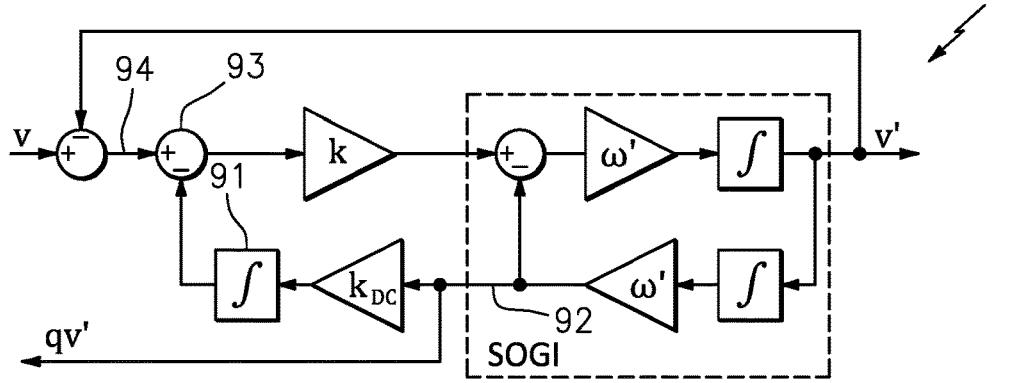
FIG. 9 is a schematic diagram of a modified SOGI including a low frequency suppression circuit in accordance with an embodiment of the present disclosure.
Figure 11:
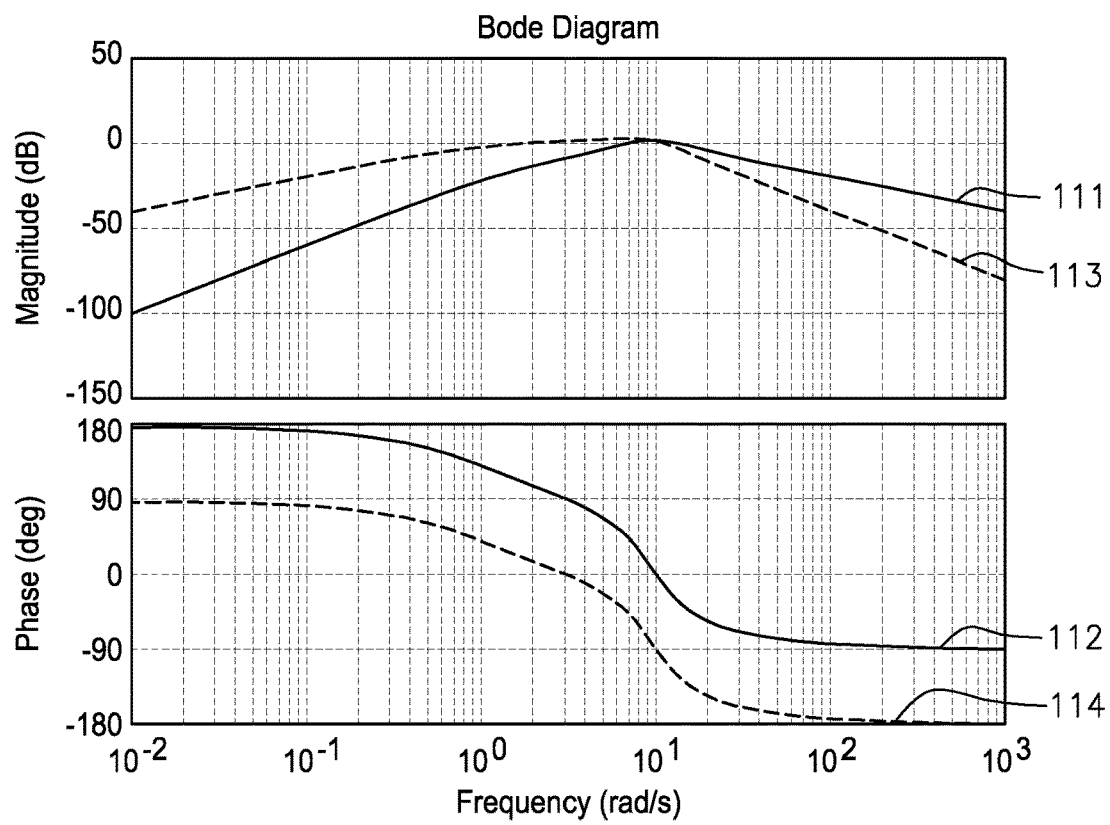
FIG. 11 is a graphical representation of the frequency response of a modified SOGI in accordance with an embodiment of the present disclosure.
Figure 12:
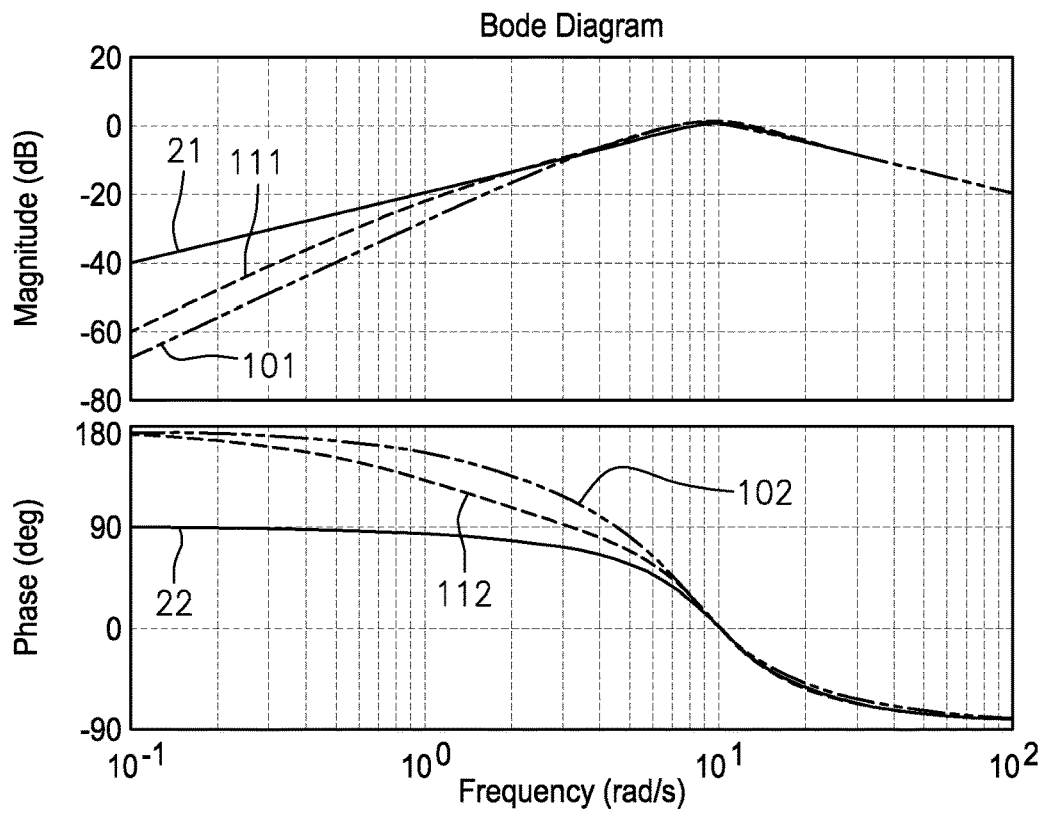
FIG. 12 is a graphical representation of the frequency response of the direct output of several embodiments of SOGIs.
Figure 13:
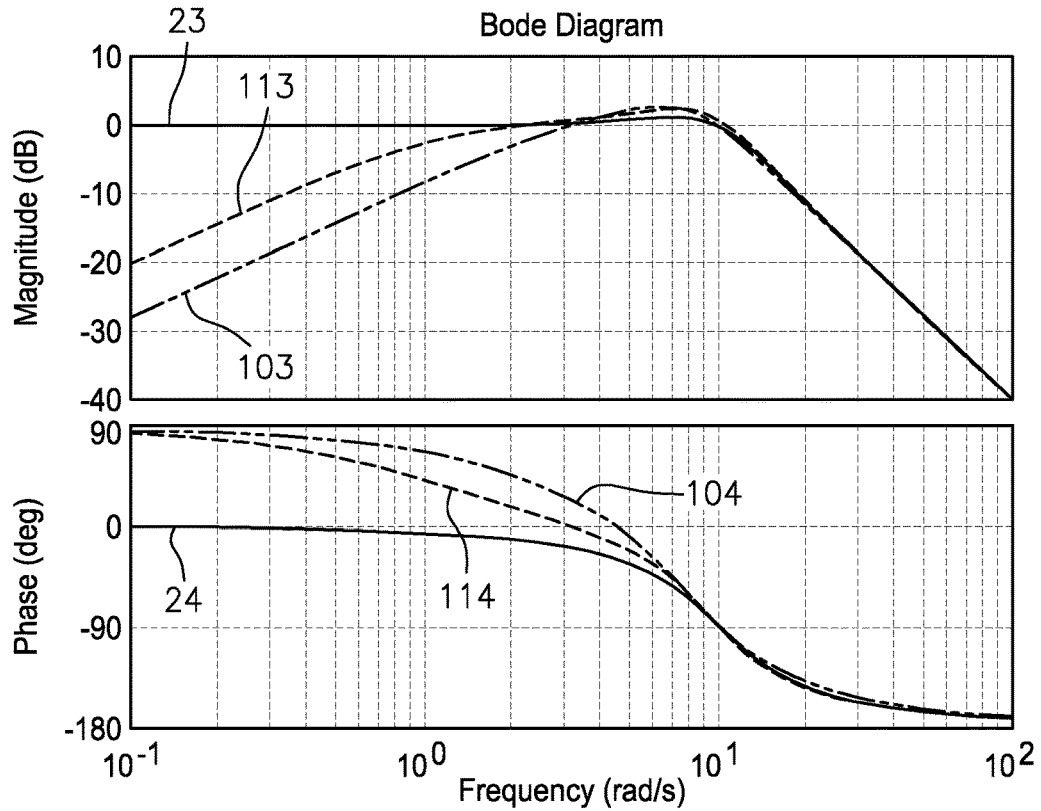
FIG. 13 is a graphical representation of the frequency response of the quadrature output of several embodiments of SOGIs.

Now referring to FIG. 9, there is shown an embodiment of a modified SOGI 90, which will be referred to herein as mSOGI 90, of the present disclosure. mSOGI 90, like dcSOGI 80 of FIG. 8, also provides low frequency and DC suppression for both its direct and quadrature outputs but has the characteristic of being simpler to implement, allowing the calculations to be performed at a faster rate than dcSOGI 80 or similar embodiments found in the prior art. As shown in FIG. 9, mSOGI is comprised of integrator 91 positioned on qv' quadrature leg 92 and the subtraction of the result from the input 94 by calculator 93. Now referring to FIG. 11, there is shown the Bode plot of mSOGI 90 where it is shown that the mSOGI of the present disclosure retains high-frequency attenuation for both direct output 111 v' and quadrature output 113 qv', and introduces low-frequency attenuation to qv'. For convenience, voltages are shown in the figure, but the mSOGI can be applied to other signals, such as currents. For purposes of direct comparison attention is drawn to FIG. 12 wherein the Bode plots for the direct output for SOGI 21, 22, mSOGI 111, 112, and dcSOGI 101, 102 are plotted on the same graphs. Similarly, and with reference to FIG. 13 there is shown the Bode plots for direct output for SOGI 23, 24, mSOGI 113, 114, and dcSOGI 103, 104 are plotted on the same graphs.

Figure 14:
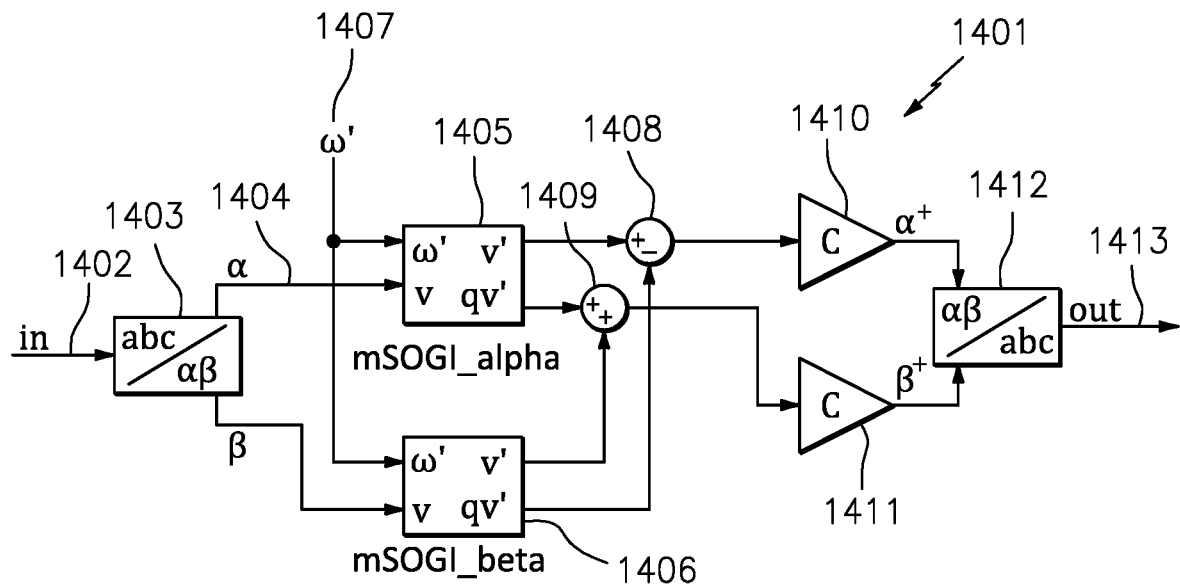
FIG. 14 is a schematic diagram of a double SOGI control structure in accordance with an embodiment of the present disclosure.

Now referring to FIG. 14, there is shown an embodiment of the present disclosure of a double SOGI control structure 1401, or DSOGI control structure which can receive three component input signals 1402, namely abc. It is within the scope of the present disclosure that such DSOGI control structure 1401 can be comprised of either two mSOGI-QSGs or two dcSOGI-QSGs, described herein before or other known DC (low frequency) suppressing SOGI. It should be appreciated by those skilled in the art that such an embodiment can successfully remove high-frequency components, low-frequency (including DC) components and imbalances from the input signals. DSOGI control structure 1401 is comprised, in this example, of a three-phase input signal 1402, an abc-αβ transformation processor 1403, an mSOGI 1405, a second mSOGI 1406, determined angular frequency input 1407, a differencing calculator 1408 and a summing calculator 1409, a first gain amplifier 1410, a second gain amplifier 1411, and a αβ-abc transformation processor 1412 to produce clean positive-sequence three-phase output signal 1413. As used herein, gain amplifiers apply a factor equal to a constant C to the incoming signals, wherein C can range from approximately 0.5 to approximately 2.

Application of DSOGI to Control Grid-Connected Inverters

Still referring to FIG. 14, the present disclosure is particularly useful in applications related to grid connected inverters (not shown) wherein the application of the DSOGI control structure 1401 described directly hereinabove is applied to provide a cleaner signal for use by a PLL. As is known, such grid connected inverters convert DC electrical power into AC power suitable for injecting into the electric utility company grid. The inverters can convert the DC signals supplied by various known power generation sources such as wind turbines, solar panels, fuel cells, biomass, combined heat and power (CHP), organic Rankine cycle turbine alternators (ORC), and other powered generation systems into AC signals suitable for such grids. The grid can also be an islanded network in which the inverter supports all or most of the load due to grid disconnection or provision of stand-alone power. In such examples, there will exist a three-phase input signal 1402 which comprise the measured grid phase voltages (derived from line voltages). The three-phase output 1413 will be voltages filtered as described immediately herein above, which voltages can be coupled to an observer such as a conventional PLL. The observer estimated angular frequency ω' can be fed back to the DSOGI and together with the angle can be supplied to the power electronic inverter control algorithm. The power electronic inverter control algorithm, can as an example, comprise a current control algorithm, wherein the output of the algorithm instructs the injection of sinusoidal currents to the grid, at a certain phase angle (power factor).

Application of a SOGI-Based Flux Integrator-QSG to Control a Motor

As is known by those skilled in the art, PLLs used for sensorless motor control normally use fluxes and do not rely on voltages, wherein flux is the integral of voltage. The reason is that the amplitude of the fluxes at the drive terminals for a given motor do not vary significantly for different predetermined speeds. The same is not true for voltages, which are proportional to speed, and thus are low at low motor speeds. This affects the dynamics of the PLL, and can cause the PLL to lose lock at low speeds.

An embodiment of the present disclosure could enable the control of a motor by use of a SOGI-based PLL working on fluxes by using an independent integrator, normally implemented in software/programmable logic, to produce the three motor fluxes, which are then passed through a DSOGI as described herein above before feeding them to an observer. However, as will be more fully described hereinafter, a separate integrator can advantageously be unnecessary, as the SOGI-QSG can be modified to also operate as a QSG for the integral of the input signal.

Figure 15:
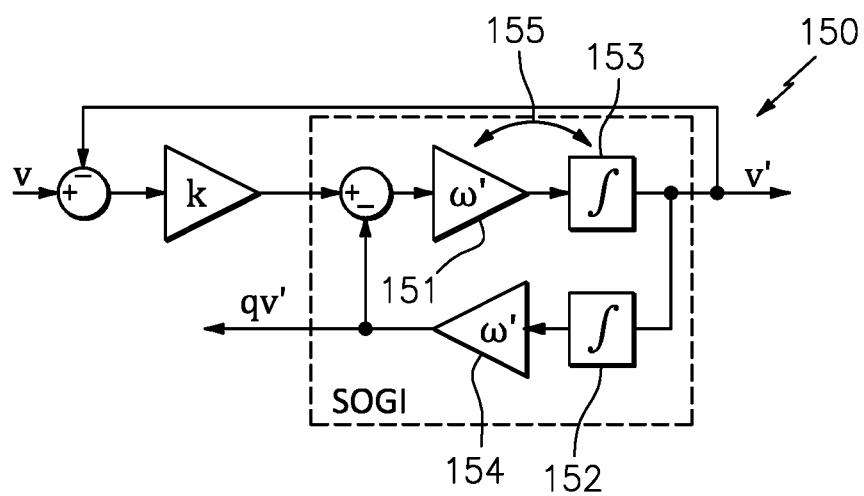
FIG. 15 is a schematic diagram of a SOGI-QSG structure of the prior art.

A known SOGI-QSG structure 150 of the prior art is shown in FIG. 15 and includes multipliers 151, 152 and integrators 153, 154. The relative arrangement of multipliers 151, 152 and integrators 153, 154 in SOGI-QSG structure 150 can be altered, for example integrator 153 can be moved before multiplier 153 as indicated by arrow 155 without any effect on its transfer function. However, this change enables the advantageous output of integrated signals as will be more fully described directly herein below.

Figure 16:
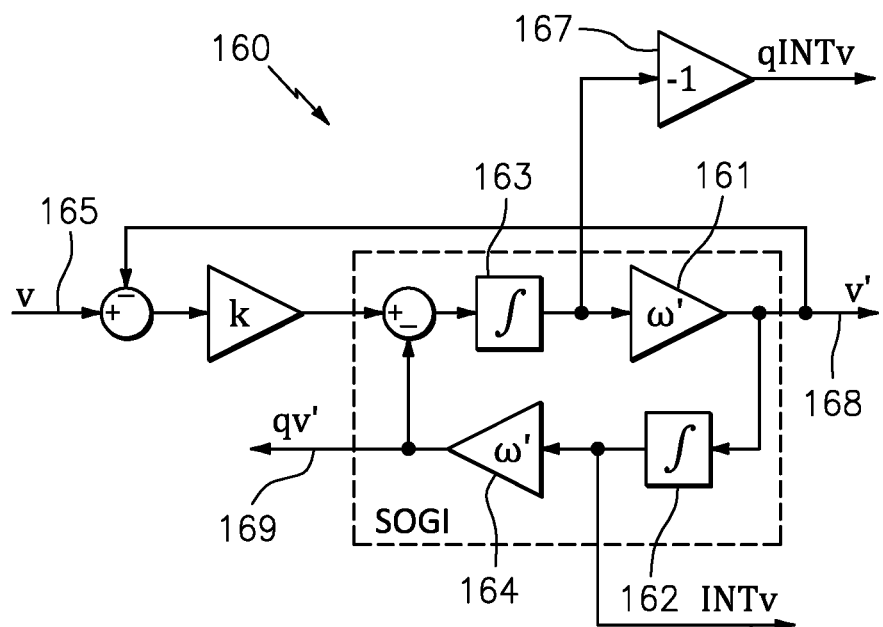
FIG. 16 is a schematic diagram of a SOGI-2QSG structure in accordance with the present disclosure.

Referring now to FIG. 16, there is shown a SOGI structure 160 wherein multipliers 161, 162 are placed after integrators 163, 164. It has been discovered that the structure of SOGI 160 enables the production of the filtered integral of the input 165 v as output 166 INTv, as well as its quadrature output signal 167 qINTv, together with direct output signal 168 v' and quadrature signal 169 qv'. This is a significant advantage over the prior art [5], [10] with respect to the implementation of systems using SOGI structure 160, as the same code or logic block can be used to generate all four signals enabling the code to run more quickly. Because SOGI structure 160 implements two (2) QSGs, one for the input signal and one for its integral, it will be referred to herein as SOGI-2QSG.

Figure 17:
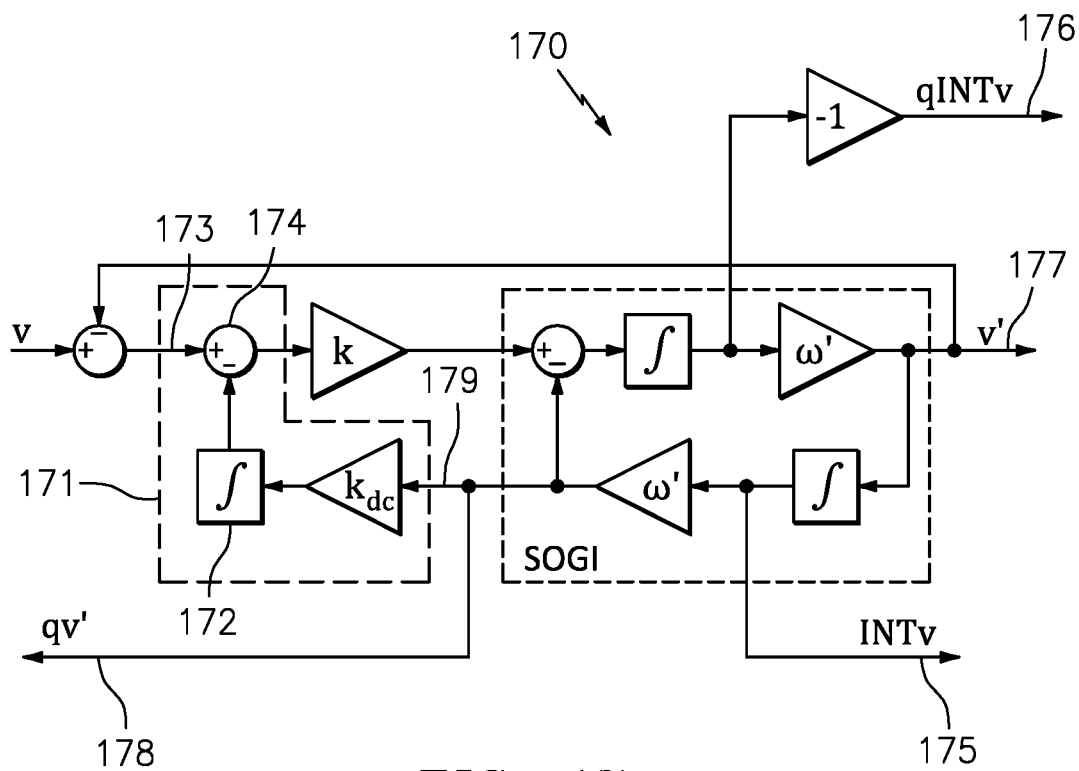
FIG. 17 is a schematic diagram of an mSOGI-2QSG structure in accordance with the present disclosure.

Referring to FIG. 17, there is shown modified SOGI 170, referred to herein as a modified second-order generalized integrator dual quadrature signal generator or mSOGI-2QSG, comprised of the same structure as SOGI structure 160 (FIG. 16) and further including mSOGI 171 which comprised of integrator 172 positioned on qv' quadrature leg 172 and the subtraction of the result from the input 173 by calculator 174. In this embodiment, mSOGI 171 works to eliminate DC components from the output signals, namely of the filtered integral of the input 173 v as filtered integral direct output signal 175 INTv, as well as its filtered integral quadrature output signal 176 qINTv, together with direct output signal 177 v' and quadrature signal output 178 qv'. It should be noted that the method of the present disclosure for acquiring INTv' and qINTv is independent of the DC suppression method of the mSOGI presented hereinabove. Thus, it is within the scope of the present disclosure that instead of employing an mSOGI, a dcSOGI or other known DC-suppression methods could be used in conjunction with the method described herein above for acquiring INTv and qINTv, to form other embodiments of SOGI-2QSG.

Figure 18:
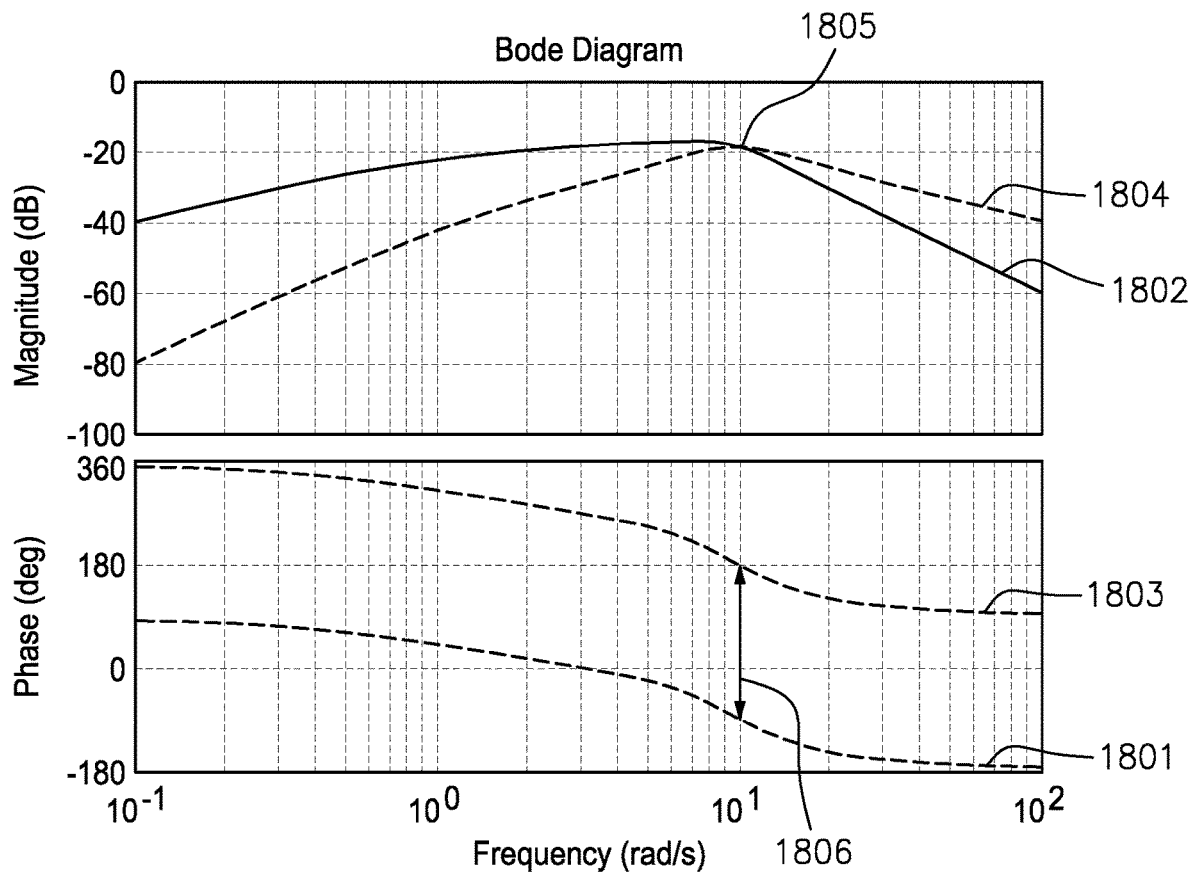
FIG. 18 is a graphical representation of the frequency response of the integrating outputs of an mSOGI-2QSG structure in accordance with the present disclosure.

Referring to FIG. 18, there is shown a Bode plot for filtered integral direct output signal 175 INTv as lines 1801, 1802, as well as its filtered integral quadrature output signal 176 qINTv as lines 1803, 1804. It can be seen that 1802 INTv is the integral of the input, because its amplitude at ω', represented by point 1805, is −20 dB, which represents the division by ω'=10 rad/s in this example, and its phase is −90 degrees. Moreover, it should be appreciated by those skilled in the art that 1804 qINTv has the same amplitude as INTv at ω', point 1805, and has a further 90-degree phase shift as compared to INTv represented by 1806.

In certain embodiments of the present disclosure, both INTv and qINTv are band-pass filtered around ω' shown as point 1805 in FIG. 18. As discussed herein above, and now with reference to FIG. 19, this enables an embodiment of the present disclosure to use the integrated outputs, namely the direct filtered integral α signal, the quadrature filtered integral α signal, the direct filtered integral β signal, and the quadrature filtered integral β signal, of mSOGI_2QSG alpha 1901 and mSOGI_2QSG beta 1902 in a novel DSOGI_INT structure 1900. The direct filtered integral α signal and the quadrature filtered integral β signal are subtracted using a difference calculator to produce a positive-sequence filtered integral α component signal, the quadrature filtered integral α signal and the direct filtered integral β signal are summed using a summing calculator to produce a positive-sequence filtered integral β component signal. When these signals are differenced they produce a negative-sequence filtered integral α component signal and a negative-sequence filtered integral β component signal. As mentioned hereinabove, the DSOGI-type structures are herein disclosed as using mSOGIs but the use of any SOGI-type structure which preferably eliminates DC components is within the scope of the present disclosure. The input 1903 to DSOGI_INT structure 1900 is a set of three-phase voltages, while the output 1904 is a set of three-phase fluxes, clean from DC, high/low frequency components and imbalances as described herein above with reference to integrated signals. Furthermore, it can be seen that a DSOGI_INT structure can be configured to operate as a DSOGI if the non-integrating outputs (v', qv') of the two mSOGI_2QSGs are used internally. This can lead to a unified structure for both DSOGI and DSOGI_INT, which is very advantageous with respect to hardware/software implementation. A single block of code or logic can therefore be implemented, which can operate both as DSOGI and as DSOGI_INT, depending on whether the non-integrating or the integrating outputs of the mSOGI_2QSGs are used, respectively.

As described herein above, the computations disclosed herein intensive and preferably implemented in logic components such as programmable gate arrays (not shown) which are commercially available from sources such as Intel® or Xilinx. The combination of the simplified control structures of the present disclosure and the speed of the logic components enables the necessary computations to be made while leaving the processor or digital signal processor free for auxiliary tasks.

For purposes of controlling a motor, it is known to first correct the terminal voltages at the drive for the resistive voltage drop in the cabling between motor and drive, and for the winding resistance of the motor itself. If the measured phase voltage is $v_p$, the measured phase current is $i_p$ and the phase resistance is $R_p$, taking into account any transformation by an interposed transformer, the effective phase voltage $v_{ep}$ is $v_{ep}=v_p-R_p i_p$. Resistance R is the sum of all phase resistances $R_p$, including cable and motor stator winding. It is also preferable to compute the reactive flux terms $L_p, i_p$, where $L_p$ is the representative series phase inductance including cable and motor stator winding. These terms may need to be adjusted for salient pole machines to take into account the inductance variation with rotor angle. Phase inductance must also include the possibly imbalanced mutual inductances, the deleterious effects of which are addressed by the present invention. So long as the calculations are consistent, if an interposed transformer is used, the entire model can be expressed at the drive or the load side of the transformer, as is readily understood by one skilled in the art, paying attention to the transformer ratio. The transformer impedance is preferably to be taken into account.

In some applications of the present disclosure for controlling a motor, the $v_p-R_p i_p$ components need to be integrated and band-pass filtered, whereas the $L_p i_p$ components only require band-pass filtering. In such embodiments of the present disclosure, a DSOGI_INT is used for the $v_p-R_p i_p$ components and a DSOGI is used for the $L_p i_p$ components to form a suitable PLL structure for estimating the rotor angle and frequency of a synchronous motor. Such an embodiment of a PLL structure is shown with reference to FIG. 20 wherein input 2003 v-Ri_abc is the three measured or drive-demanded phase voltages, or the three component phase voltage signal, each corrected for ohmic voltage drop and input 2004 Li_abc is the three component reactive phase flux drop signal each calculated from inductance and phase current. PLL structure 2000 comprises a second-order generalized integrator dual quadrature signal generator DSOGI_INT 2001 and DSOGI 2002, low pass filter (LPF) 2007, and observer 2009. Within DSOGI_INT 2001 the integrating outputs (INTv, qINTv) of a pair of mSOGI-2QSGs are used, such as DSOGI_INT structure 1900 (FIG. 19) shown herein above. Similarly, DSOGI 2002 for processing input 2004 Li_abc can comprise a DSOGI structure 1401 (FIG. 14) or a DSOGI_INT structure 1900 (FIG. 19) having a pair of mSOGI-2QSGs of which the non-integrating outputs (v', qv') are used internally.

The respective (αβ or abc) filtered flux signal 2006 (which is the integral of voltage signal), and filtered reactive phase flux drop signal 2005 are directed to calculator 2008 to produce an estimated rotor flux signal 2012 and then passed on to observer processor 2009. The estimated frequency signal 2010 is passed to low pass filter 2007 and fed as filtered estimated frequency signal 2011 ω' to DSOGI_INT 2001 and DSOGI 2002. Observer 2009 can comprise any suitable observer such as a classic SRF-PLL type disclosed herein above. The low-pass filter can comprise any type of finite impulse response (FIR) or infinite impulse response (IIR) filter with a low-pass characteristic. Moreover, as mentioned hereinabove, the DSOGI-type structures are herein implemented using mSOGIs but any SOGI-type structure which preferably eliminates DC components could be used without departing from the scope of the disclosure. The amplitude of signal 2012 can be changed by placing a gain device (similar to 2107 of FIG. 21) since the angle and frequency of a balanced signal doesn't vary with amplitude without departing from the scope of the present disclosure.

Figure 20:
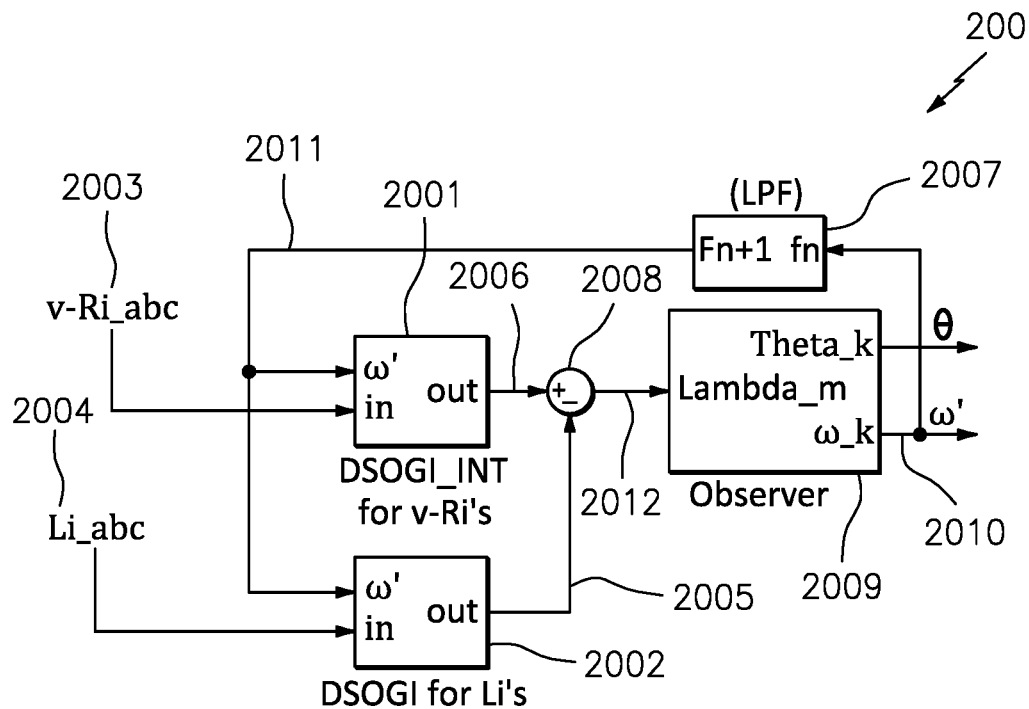
FIG. 20 is a schematic diagram of a SOGI based PLL structure for synchronous motor control in accordance with the present disclosure.
Figure 21:
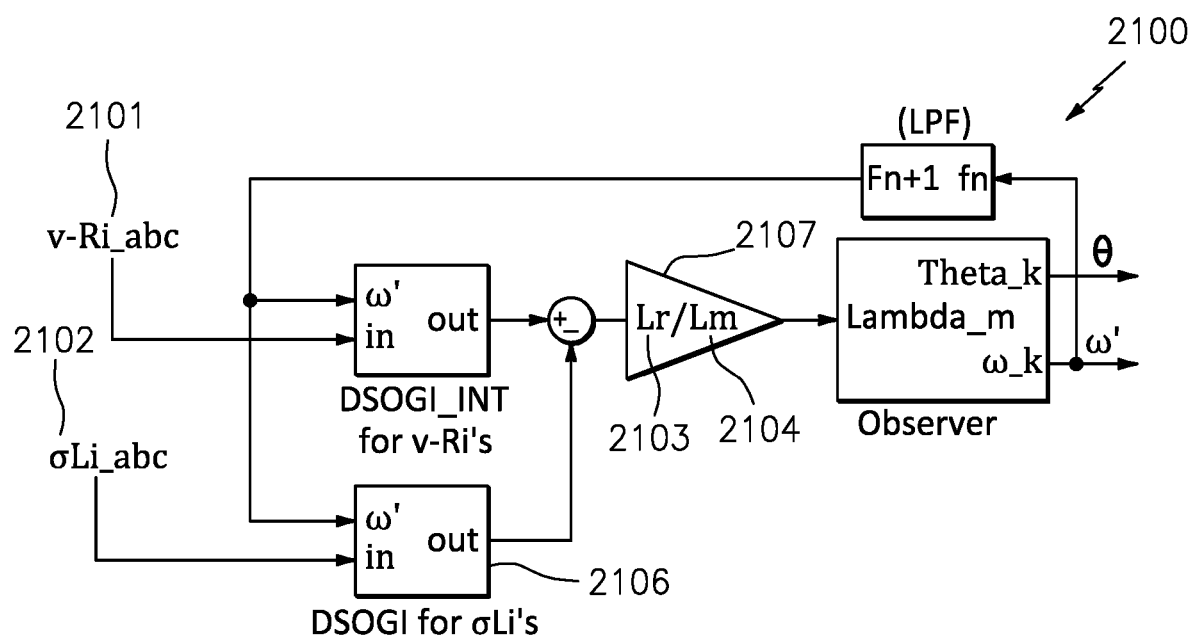
FIG. 21 is a schematic diagram of a SOGI based PLL structure for asynchronous motor control in accordance with the present disclosure.

Although the embodiment of FIG. 20 is directed at the control of synchronous motors, respective structures of the present disclosure, based on DSOGI-type structures (integrating and non-integrating), can be derived for the control of asynchronous motors as well. Referring to FIG. 21, an example PLL structure 2100 of the present disclosure, for the estimation of rotor flux angle and frequency of a typical squirrel cage induction motor (not shown) is shown. In this embodiment, input 2101 v−Ri_abc and input 2102 σLi_abc three component reactive phase flux drop signal are similar to those described in FIG. 20 herein above, wherein the stator inductance is L, while rotor inductance 2103 Lr and magnetizing inductance 2104 Lm are used by gain device 2107 to output an estimated filtered rotor flux signal. However, any suitable gain, such as unity, can be used in place of Lr/Lm in device 2107 since the angle and frequency of a mutli-phase flux signal is independent of its amplitude. The leakage flux coefficient 2105 σ, expressed as $\sigma=1-Lm^2/(L*Lr)$ is applied to input 2102 to pass on to an observer processor. It should be noted that the shaft angle and the rotor flux angle have a fixed relation for synchronous motrs and that for asynchronous motor they do not have a fixed relationship.

Embodiments of the present disclosure have been tested using simulation techniques with artificially distorted inputs, under steady-state and dynamic conditions. An embodiment of the control system was also simulated for driving a permanent magnet motor. The testing included flat armored cables, which those skilled in the art can appreciate that include imbalanced mutual inductances, and wherein instability problems have been encountered. These instabilities were reproduced in simulations and when using the mSOGI-2QSG-based PLL in accordance with the present disclosure were eliminated from the PLL's output. Another advantage of embodiments of the present disclosure is that the mutual inductance of a flat armored cable does not need to be calculated a priori, such as from an electromagnetic finite element analysis, for each application.

Figure 19:
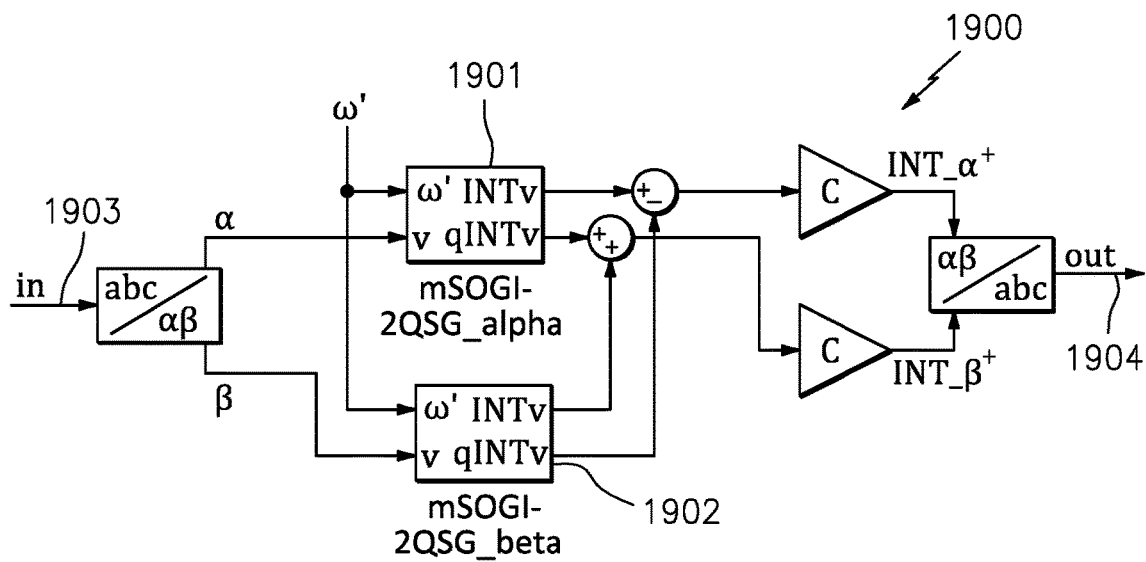
FIG. 19 is a schematic diagram of a DSOGI_INT structure in accordance with the present disclosure.
Figure 22:
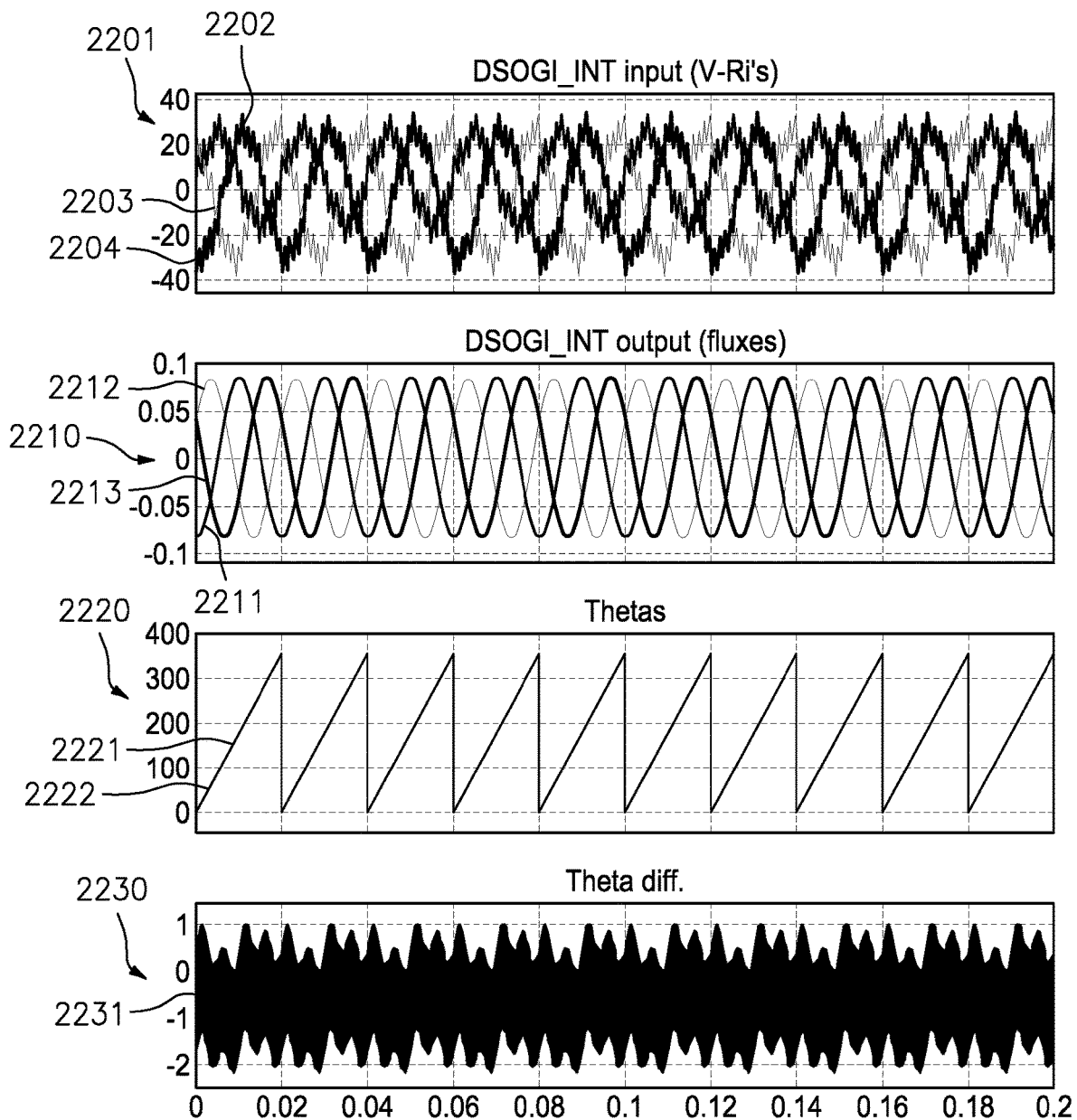
FIG. 22 is a graphical representation of the output of an embodiment in accordance with the present disclosure.

The following include simulation results that illustrate the capabilities under extreme conditions of the above described mSOGI-2QSG-based PLL of the present disclosure in FIG. 19, used as 2001 in FIG. 20. For purposes of clarity, input 2004 and DSOGI 2002 in FIG. 20 are not included in this example, to focus on the integrating function of DSOGI_INT in accordance with the present disclosure. Referring to FIG. 22, there is shown four plots from the same time span for an embodiment of the present disclosure wherein plot 2201 shows artificially heavily distorted three phase inputs v-Ri's 2202, 2203, 2204. Plot 2210 shows the output fluxes 2212, 2213, 2214. Plot 2220 shows the estimated angle output theta from the observer 2221 and actual angle output 2222 (coincident upon one another) and is plotted between 0 degrees and 360 degrees. Plot 2230 shows the angle error 2231 between the angle estimated by the observer and the angle used to build the artificial input waveforms. Examination of plot 2201 of the input v-Ri's 2202, 2203, 2204 to DSOGI_INT shows them having high frequency harmonics, DC offsets and imbalance. Namely, input 2202 has both a lower amplitude a DC offset from that of input voltages 2203, 2204. Examination of plot 2210 of fluxes 2211, 2212, 2213 of DSOGI_INT output shows all of the fluxes to be free of harmonics, balanced in amplitude and having zero, or practically zero, DC offset with respect to each other. Examination of plots 2220 and 2230 demonstrates the accuracy of the estimate angle, which can be seen to be within +1/−2.1 degrees from the actual angle.

Figure 23:
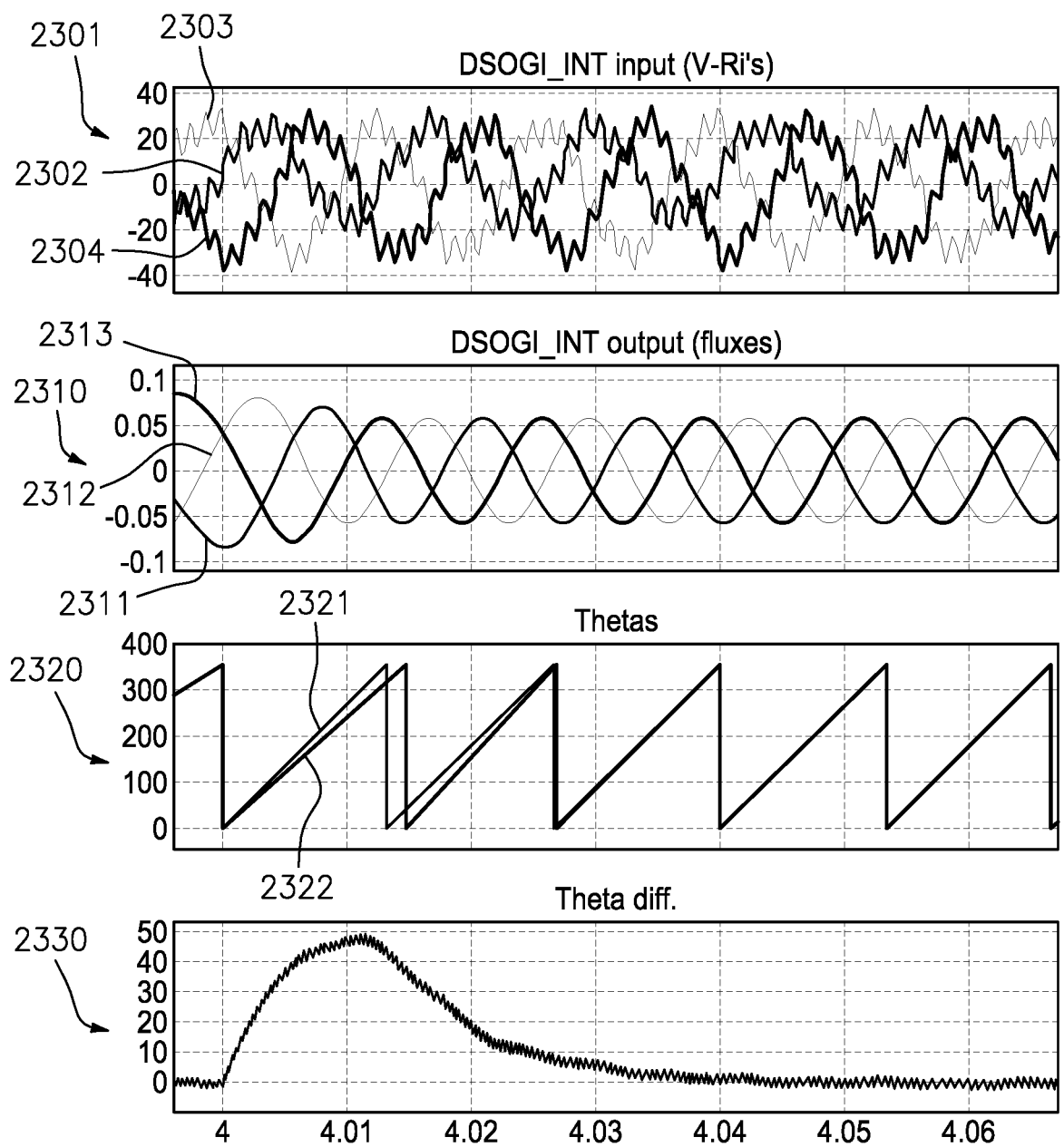
FIG. 23 is a graphical representation of the output of an embodiment in accordance with the present disclosure.

Now referring to FIG. 23, which aims to demonstrate the transient response of the DSOGI_INT of FIG. 19, there is shown a simulation of its response to a 50% fundamental frequency step increment, from 50 Hz to 75 Hz, of the input v-Ri's. Plot 2301 shows the three phase inputs 2302, 2303, 2304 having a superimposed ripple, DC offsets and imbalance. Plot 2310 shows the output fluxes 2312, 2313, 2314. Plot 2320 shows the angle output 2321 theta from the observer and is plotted between 0 degrees and 360 degrees. Plot 2330 shows the angle error 2331, measured as in FIG.

22. During the transient the period of the voltages 2302, 2303, 2304 is changing. One skilled in the art can understand that the amplitude of the output fluxes 2311, 2312, 2313 in plot 2310 is reduced due to this change. Examination of this plot reveals that, in accordance with the present disclosure, output fluxes, even during the transient, are well balanced and allow the observer to produce the correct angle 2321. Examination of plot 2330 shows a transient, or settling, time for the angle of ~50 ms.

Figure 24:
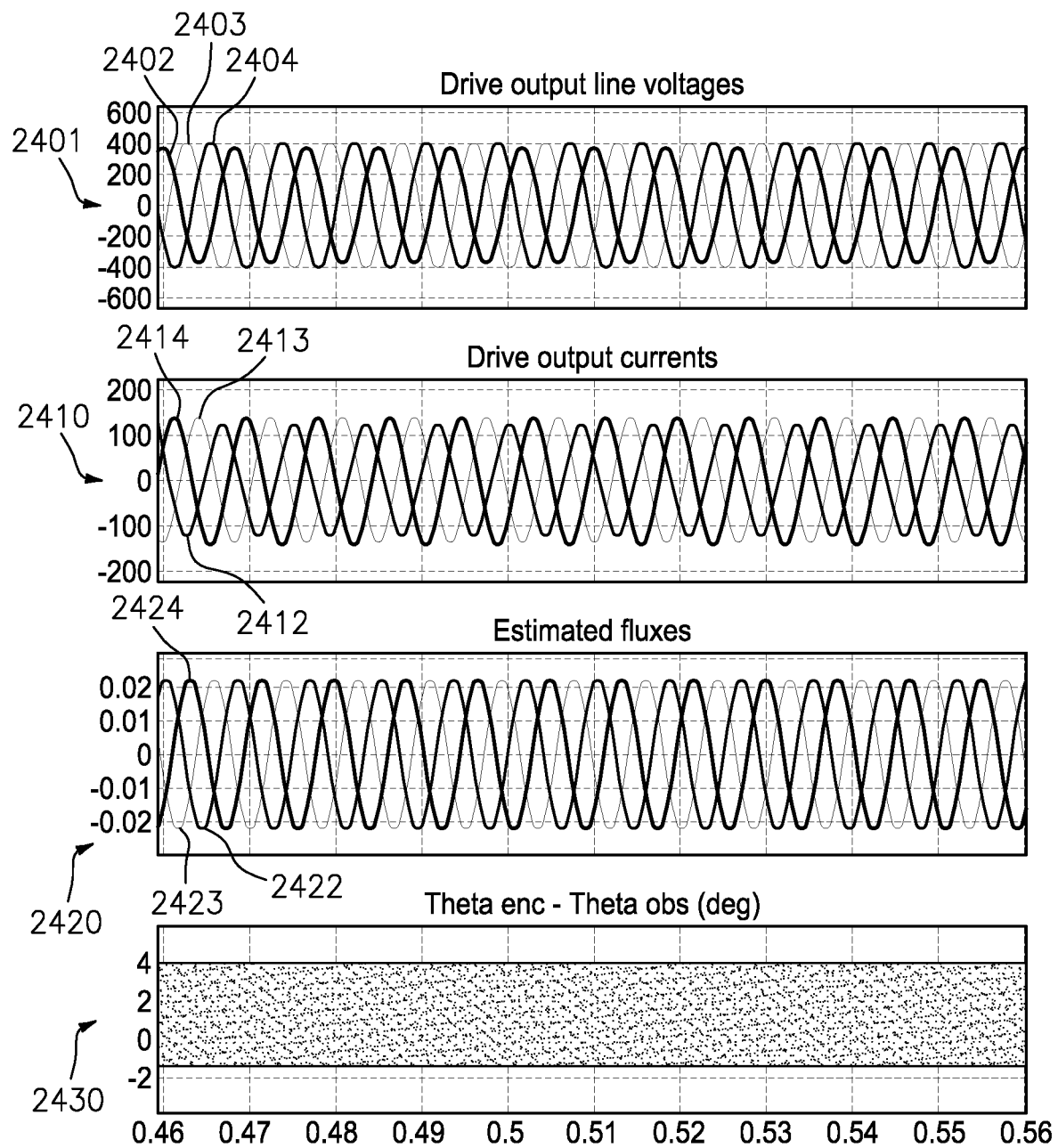
FIG. 24 is a graphical representation of the output of an embodiment in accordance with the present disclosure.

Now referring to FIG. 24, there is shown a simulation of the response of the present disclosure as disclosed with reference to FIG. 20, for driving a permanent magnet motor over a 1.4 km flat armored cable with imbalanced mutual inductances. Plot 2401 shows the three phase drive output voltages 2402, 2403, 2404. Plot 2410 shows the drive output currents 2412, 2413, 2414 to the motor. Plot 2420 shows the output fluxes 2422, 2423, 2424. Plot 2430 shows the angle error 2431 as measured between a shaft angle encoder and the observer estimate. As can be seen from the plots, the drive produces balanced voltages 2402, 2403, 2404, resulting in imbalanced load currents 2412, 2413, 2414, due to the cable imbalance. Nevertheless, the estimated fluxes (2012 in FIG. 20) are balanced, aiding the observer to produce a small angle error, as shown in plot 2430. This condition has been extensively tested experimentally as well, yielding results that agree with those herein presented.

It is therefore shown and described herein above how the enhanced SOGI-based structures, namely the mSOGI, SOGI-2QSGs and DSOGI_INT of the present disclosure can be used to form a more robust PLL for motor control applications. The PLL of the present disclosure is immune to high/low-frequency harmonics, DC and load imbalance, such as that caused by flat armored cables shown in FIG. 24, thus providing an accurate motor angle and speed estimate.

The embodiments described herein above are of a PLL that can provide accurate estimates of frequency and angle which provide for an accurate motor angle and speed estimate in the face of distortions and imbalances. In addition, embodiments of the present disclosure are drawn to embodiments of a controller of a motor or grid connection to ensure balanced output currents. The combination of such embodiments of PLL and balanced current control ensures stable system behavior and higher power quality, offering several advantages over the prior art such as robustness and power loss reduction for motor control applications, and meeting of interconnection standards for grid-connected inverters.

Figure 7:
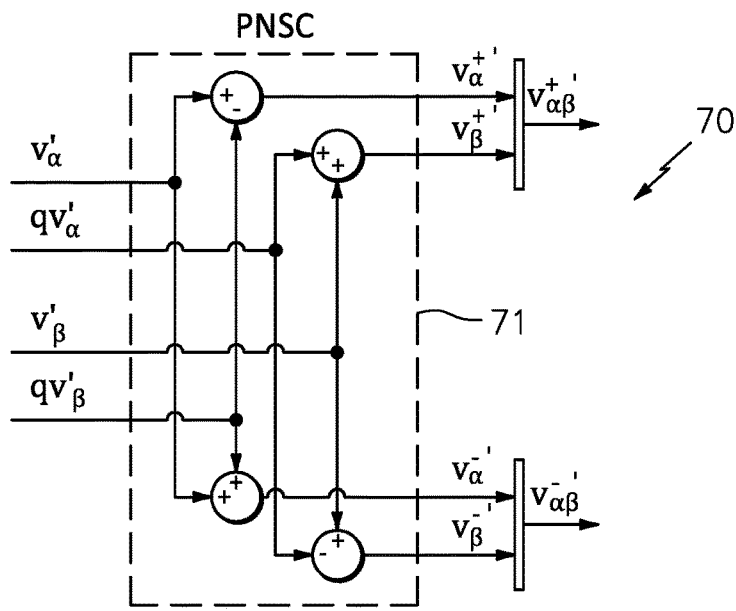
FIG. 7 is a schematic diagram of a positive and negative-sequence calculator of the prior art.

With reference to the prior art described herein above relating to PNSC, a feature of the present disclosure is that the output of a PNSC is applied in a control structure for the derivation (and then the control) of the symmetrical components of currents. As described herein before with reference to FIG. 7, PNSCs of the prior art, employ voltages. Also as described hereinbefore, for efficient and stable operation of motors, and for injection of quality power to the grid, balanced currents are required, which does not necessarily imply balanced voltages at the drive.

Figure 25:
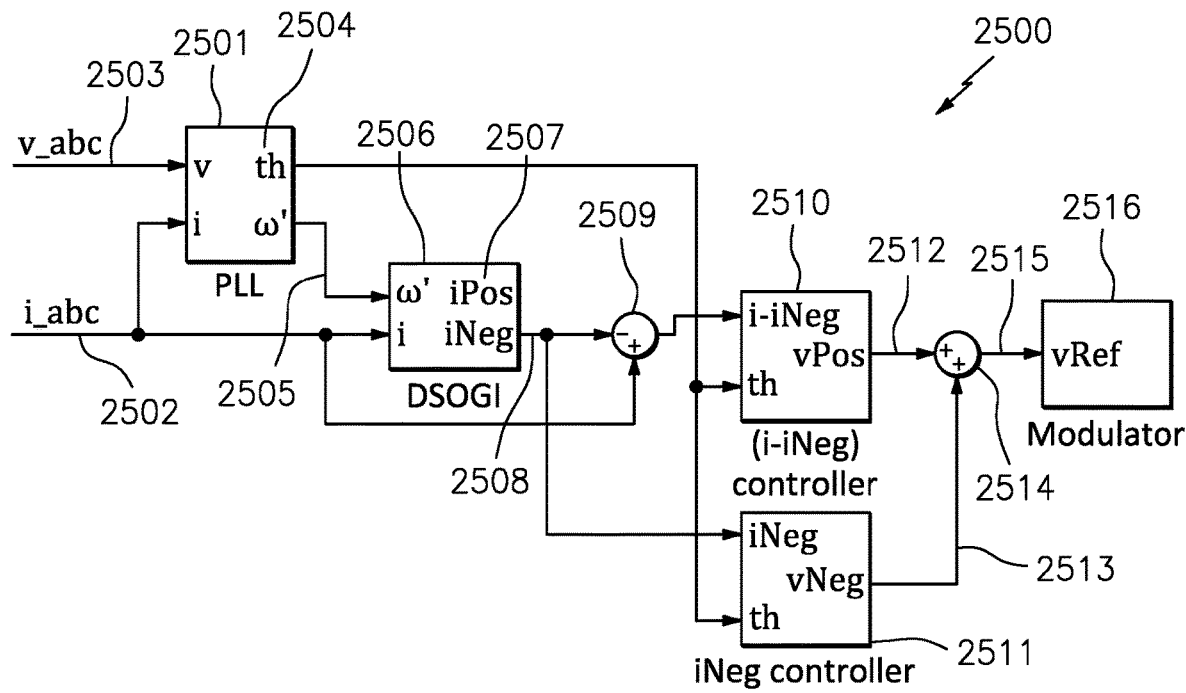
FIG. 25 is a schematic diagram of a system to suppress current imbalance in accordance with the present disclosure.

Referring to FIG. 25, an embodiment of an overall system 2500 to suppress current imbalance of the present disclosure, including a PLL 2501 and a decoupled double synchronous reference frame (DDSRF) current controller, i-iNeg controller 2510 and iNeg controller 2511, is shown. The three component current signal or current feedback 2502 i_abc is read from the inverter/drive output (not shown), and passed to PLL 2501 (wherein the PLL can be SOGI-based or other known PLL), together with output voltages 2503 v_abc, the three component phase voltage signal, along with necessary parameters to calculate estimated angle 2504 θ, depending on the application (grid or motor), and estimated frequency signal 2505 ω' of the load. Although PLL 2501 is shown generally by example, the PLL structure and inputs can vary, depending on the type of load, e.g. grid or motor (injection or control). It has to be noted as well that for the case of a motor, the PLL can be substituted by an apparatus that can measure the rotor speed and angle, such as a shaft encoder. Current feedback 2502 i_abc is also passed to DSOGI structure 2506, which preferably includes some type of DC suppression method, such as an mSOGI described herein above. DSOGI 2506 also receives the estimated angular frequency 2505 ω' from PLL, and produces the positive-sequence 2507 iPos and negative-sequence 2508 iNeg components of current feedback 2502 i_abc, by means of a PNSC. The quantity of the difference between negative-sequence 2508 iNeg and components of current feedback 2502 i_abc (i_abc−iNeg) for each phase is passed to positive-sequence current calculator 2509. In this particular embodiment, the positive-sequence currents 2507 iPos are not used because they are heavily filtered by the DSOGI. It has been discovered that using the difference between negative-sequence 2508 iNeg and components of current feedback 2502 i_abc to produce a respective differenced negative-sequence current component signal (i_abc−iNeg) and use it instead of iPos as input to the i-iNeg controller 2510 improves its response to fast transients. The i-iNeg controller 2510 also works using estimated angle 2504 θ from the PLL 2501 as input to produce positive-sequence voltage component signal 2512 vPos and a dq current reference which will be discussed in more detail with respect to a positive-sequence control block herein below with reference to FIG. 27. The dq current reference is set to control the drive output current amplitude and power factor as is known in the prior art. In addition, iNeg 2508 is passed to the negative-sequence current controller 2511. As shown in the more detailed negative-sequence control block diagram of FIG. 28 herein below, the dq current references for this controller are normally zero, so that the imbalance is suppressed. The iNeg controller 2511 controller works using estimated angle 2504 θ from the PLL 2501 and negative-sequence 2508 iNeg from DSOGI 2506 to produce negative-sequence voltage component signal 2513 vNeg. The outputs of the two controllers, positive-sequence voltage component signal 2512 vPos and negative-sequence voltage component 2513 vNeg, are added using calculator 2514 to produce the voltage references 2515 vRef that are then passed to modulator 2516. As is known in the prior art, modulators such as a sinusoidal pulse width modulators covert the voltage references to the actual voltages that the inverter applies to the connected load (e.g. grid or motor).

Figure 26:
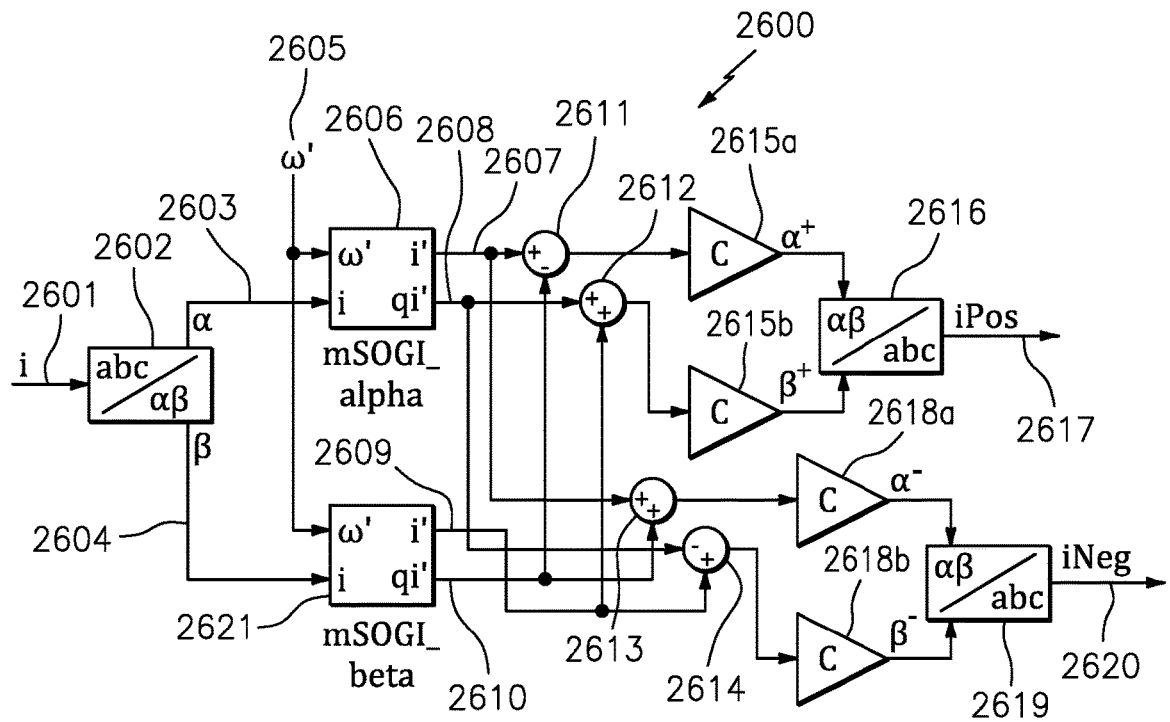
FIG. 26 is a schematic diagram of the DSOGI block of a system to suppress current imbalance in accordance with the present disclosure.

Referring now to FIG. 26, there is shown an example of an embodiment of an mSOGI structure 2600 for implantation in place of the generalized DSOGI 2506 of FIG. 25. In other words, this particular DSOGI is implemented using an mSOGI embodiment merely as an example and as set forth herein above, any SOGI-type structure which preferably suppresses DC components could be used without departing from the scope of the present disclosure. mDSOGI structure 2600 is comprised, in this example, of an input current 2601 i that is fed into transformation processor 2602 abc-αβ, to produce the input current αβ components 2603, 2064 respectively. An estimated angular frequency 2605 ω' is fed to mSOGI_alpha 2606 along with α output current 2603 to produce direct output current 2607 i' and quadrature output current 2608 qi' for the alpha component of the input current 2603. Similarly, estimated angular frequency 2605 ω' is fed to mSOGI_beta 2621 along with β output current 2604 to produce direct output current 2609 i' and quadrature output current 2610 qi' for the beta component of the input current 2604. Quadrature output current 2610 qi' is subtracted from direct output current 2607 i' using calculator 2611. Quadrature output current 2608 qi' is added to direct output current 2609 i' using calculator 2612. Calculator 2613 is used to add direct output current 2607 i' with quadrature output current 2610 qi'. Similarly, calculator 2614 is used to difference quadrature output current 2608 qi' from direct output current 2609 i'. The output from calculator 2611 and calculator 2612 are fed to gain 2615a to output a positive-sequence α component signal and to gain 2615b to produce a positive-sequence β component signal and on to αβ-abc inverse transformation processor 2616 to produce positive-sequence current signal 2617 iPos. Similarly, the output from calculator 2614 and calculator 2613 are fed to gain 2618a to output a negative-sequence α component signal and to gain 2618b to produce a negative-sequence β component signal and on to αβ-abc inverse transformation processor 2619 to produce negative-sequence current signal 2620 iNeg. It should be noted for completeness that positive-sequence currents 2617 iPos and negative-sequence currents 2620 iNeg are the specific outputs of mSOGI structure 2500 that are generally referred to in FIG. 25 as positive-sequence currents 2507 iPos and negative-sequence currents 2508 iNeg. It can also be noted that system 2600 can be applied to voltages or other input signals, and can be derived from system 1401 in FIG. 14 with the addition of the negative-sequence component calculator of the PNSC 70 of FIG. 7.

Figure 27:
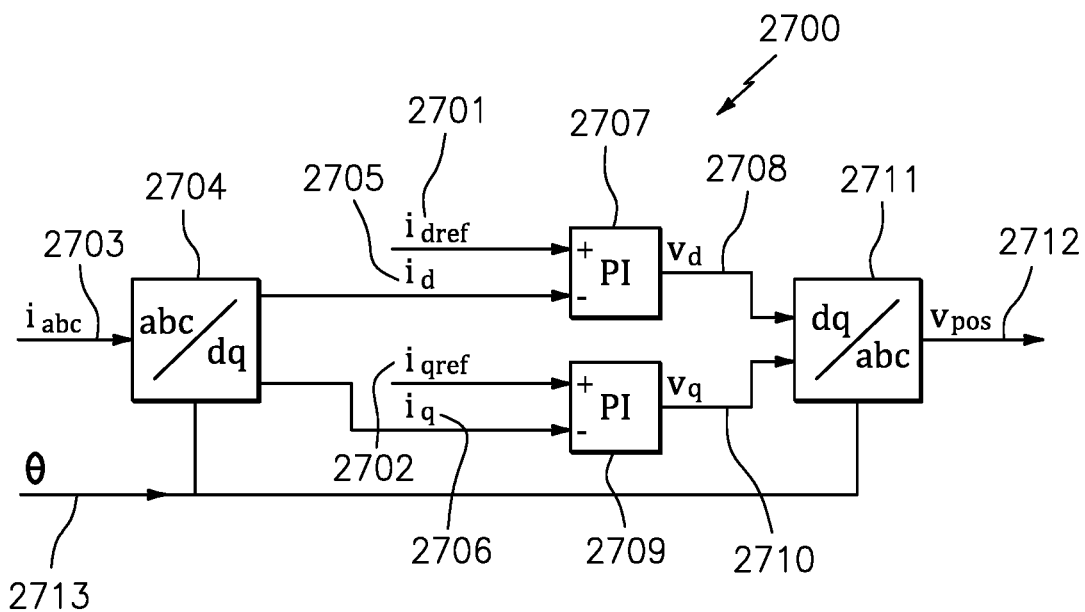
FIG. 27 is a schematic diagram of a positive-sequence current controller in accordance with the prior art.

Now referring to FIG. 27 there is shown a positive-sequence current controller 2700, which is a specific embodiment of i-iNeg controller 2510 of FIG. 25, with direct current reference 2701 $i_{dref}$ and quadrature current reference 2702 $i_{qref}$ set according to desired drive output current and power factor. Input current 2703 $i_{abc}$ is fed into a transformation processor in the form of transformation matrix 2704 to produce direct current component signal 2705 $i_d$ and quadrature current component signal 2706 $i_q$. Direct current reference signal 2701 $i_{dref}$ and direct current component signal 2705 $i_d$ are fed to proportional integral (PI) controller 2707 to produce direct voltage component signal 2708 $v_d$. Quadrature current reference signal 2702 $i_{qref}$ and quadrature current component signal 2706 $i_q$ are fed to PI controller 2709 to produce quadrature voltage component signal 2710 $v_q$. Transformation matrix 2711 is a transformation processor that converts direct voltage component 2708 $v_d$ and quadrature voltage component 2710 $v_q$ to three-phase (abc) positive-sequence voltage component signal 2712 $v_{Pos}$, using the estimated angle 2713 θ. It should be noted for completeness that positive-sequence voltage component signal 2712 vPos is the specific output of a positive-sequence current controller 2700 and that is generally referred to in FIG. 25 as positive-sequence voltage component signal 2512 vPos.

Figure 28:
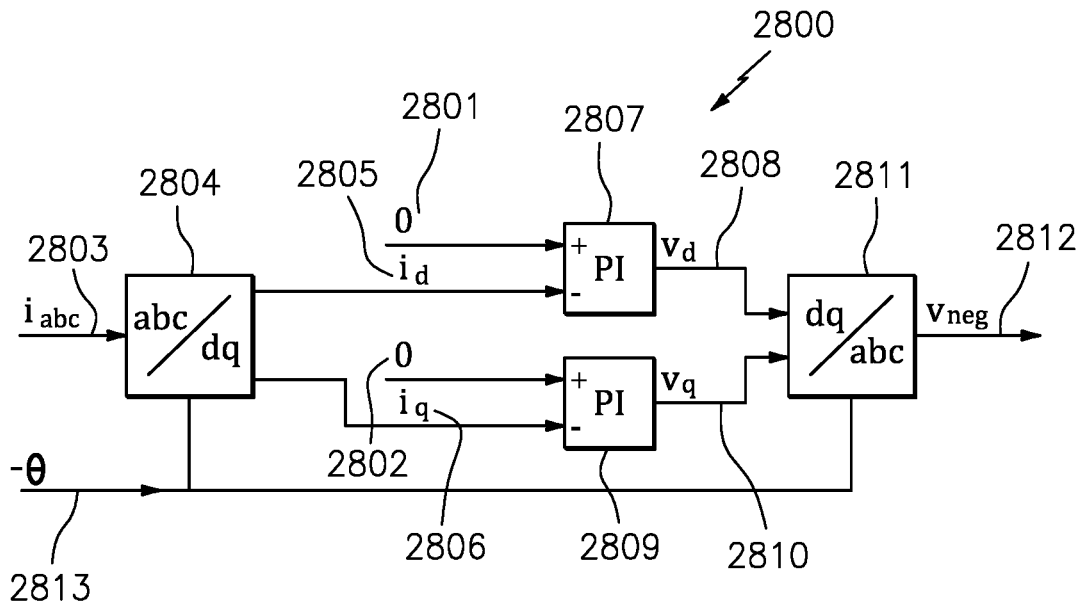
FIG. 28 is a schematic diagram of a negative-sequence current controller in accordance with the present disclosure.

Now referring to FIG. 28 there is shown a negative-sequence current controller 2800, which is a specific embodiment of an iNeg controller 2511 of FIG. 25, with direct current reference 2801 set to zero, or a zero reference signal, and quadrature current reference 2802 also set zero reference signal. In this particular embodiment, negative-sequence current controller 2800 with zero dq reference works to eliminate drive output current imbalance. Input current 2803 $i_{abc}$ is fed into transformation processor 2804 to produce direct current component 2805 $i_d$ and quadrature current component 2806 $i_q$. Since direct current reference 2801 is zero it has no effect as direct current component 2805 $i_d$ is fed to proportional integral (PI) controller 2807 to produce direct voltage component 2808 $v_d$. Quadrature current reference 2802 is zero and quadrature current component 2806 $i_q$ is similarly fed to PI controller 2809 to produce quadrature voltage component 2810 $v_q$. Transformation processor 2811 converts direct voltage component 2808 $v_d$ and quadrature voltage component 2810 $v_q$ into three-phase (abc) negative-sequence voltage component 2812 $v_{neg}$, using the negative of estimated angle 2813–θ. It should be noted for completeness that negative-sequence voltage component 2812 $v_{neg}$ is the specific output of a negative-sequence current controller 2800 and that is generally referred to in FIG. 25 as negative-sequence voltage component signal 2512 vNeg.

Certain embodiments of the present disclosure, such as those disclosed with reference to FIG. 25, are useful for generating balanced currents into an imbalanced grid. Such embodiments of PLLs as disclosed herein earlier were mainly directed at applications for grid-connected inverters.

Sensorless Motor Vector Control

Figure 29:
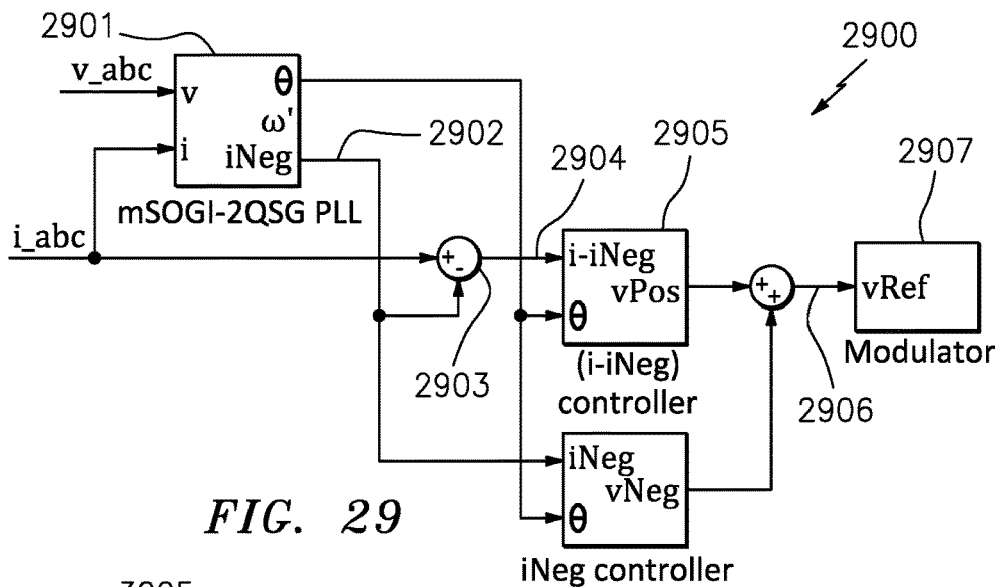
FIG. 29 is a schematic of a control system to suppress current imbalance in a synchronous motor in accordance with the present disclosure.

Referring now to FIG. 29, the embodiment is similar to that described herein above in FIG. 25 except that it has been discovered that overall control system 2900 eliminates the need for DSOGI 2506 on the current leg. Specifically, there is shown an overall control system 2900 that comprises an mSOGI-2QSG PLL 2901 using a three component phase voltage signal and a three component current signal as input. The mSOGI-2QSG PLL 2901 is similar to that described as 2000, to derive θ and ω' and in addition to provide the negative-sequence component of the three component input current signal, as will be described hereinbelow. Upon examination of output 2005 in control system 2000, it can be seen that this is equal to L*iPos. Thus, a division by L, or rather, leaving the multiplication by L for after the DSOGI block 2002, can provide iPos. Also, the PNSC calculations shown herein above can be added to derive negative-sequence currents 2902 iNeg from the same block, as well. This eliminates the need for the DSOGI block 2506 (of FIG. 25). Using the above equations to derive negative-sequence currents 2902 iNeg, and using calculator 2903, produces the positive-sequence current 2904 as i-iNeg used in i-iNeg controller 2905. It should be noted that reference voltage signal 2906 vRef passed to modulator 2907 is the specific output of overall control system 2900 and that it is similar to that generally referred to in FIG. 25 reference voltage 2515 vRef. Such an embodiment of overall control system 2900 is readily applied to classic synchronous motor control (such as permanent magnet motors).

Figure 30:
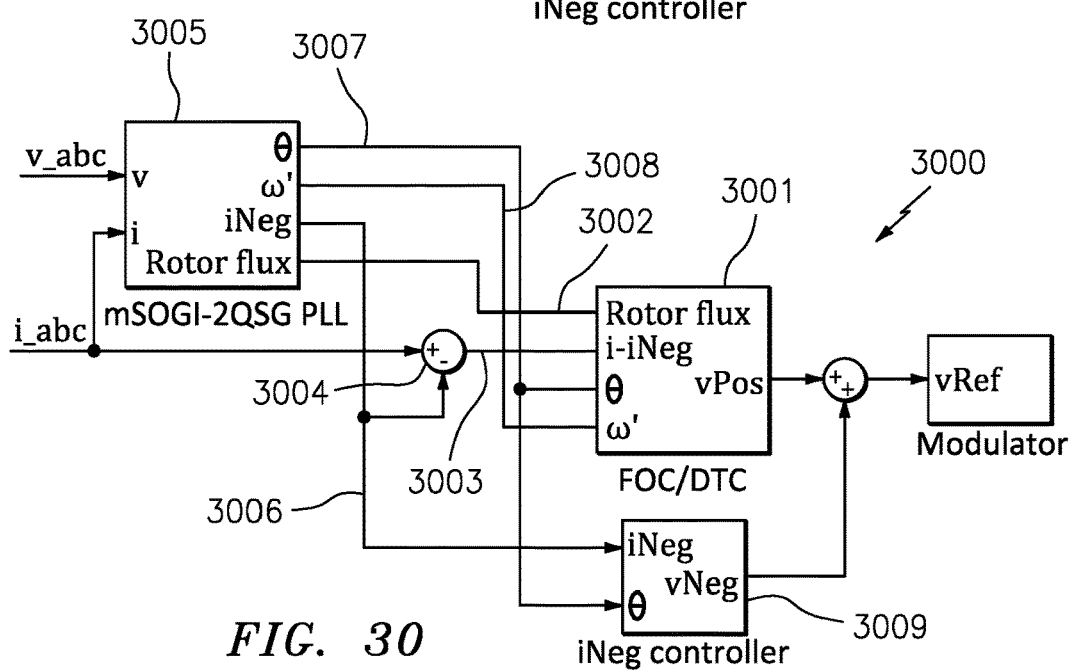
FIG. 30 is a schematic of a control system to suppress current imbalance in a Vector controlled asynchronous motor in accordance with the present disclosure.

However, this approach can be extended to also apply to more advanced synchronous or asynchronous motor control (such as induction motors). Referring now to FIG. 30, there is shown an embodiment of an overall control system 3000 which comprises FOC/DTC block 3001 which can include any prior art Field-Oriented Control (FOC) or Direct Torque Control (DTC) approach, wherein such approaches are normally designed under the assumption of balanced loads. FOC/DTC block 3001 regulates the rotor flux level and the predetermined torque level using the positive-sequence current 3003 i-iNeg from calculator 3004. The mSOGI-2QSG PLL 3005 is similar to that described as 2100, to derive rotor flux angle 3007 θ and estimated frequency signal 3008 ω' and in addition to provide the negative-sequence component of the three component input current signal 3006 (as disclosed with reference to mSOGI-2QSG PLL 2901 of FIG. 29) as well as the estimated rotor flux signal 3002 (as disclosed with reference to the output of 2107 of FIG. 21). Signal iNeg 3006 is used by calculator 3004 to produce positive-sequence current 3003 as i-iNeg, which is suppressed by iNeg controller 3009. The current balancing capability of control system 3000 of the present disclosure provides a major advantage over the prior art with respect to motor losses and overall performance.

It should be noted that in the various figures the notation th, Theta and θ all mean the estimated electrical phase angle of the synchronous rotor flux/poles. In an asynchronous motor this is not proportional to the physical shaft angle, as the shaft speed differs from the synchronous speed (due to slip).

Induction Motor Scalar (V/f) Control

Figure 31:
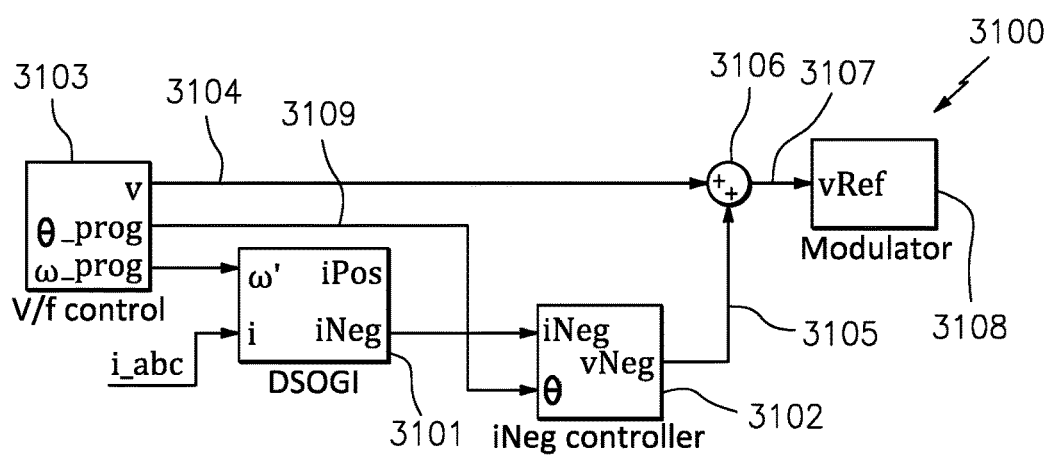
FIG. 31 is a schematic of a control system to suppress current imbalance in a scalar (V/f) controlled asynchronous motor in accordance with the present disclosure.
Figure 32A:
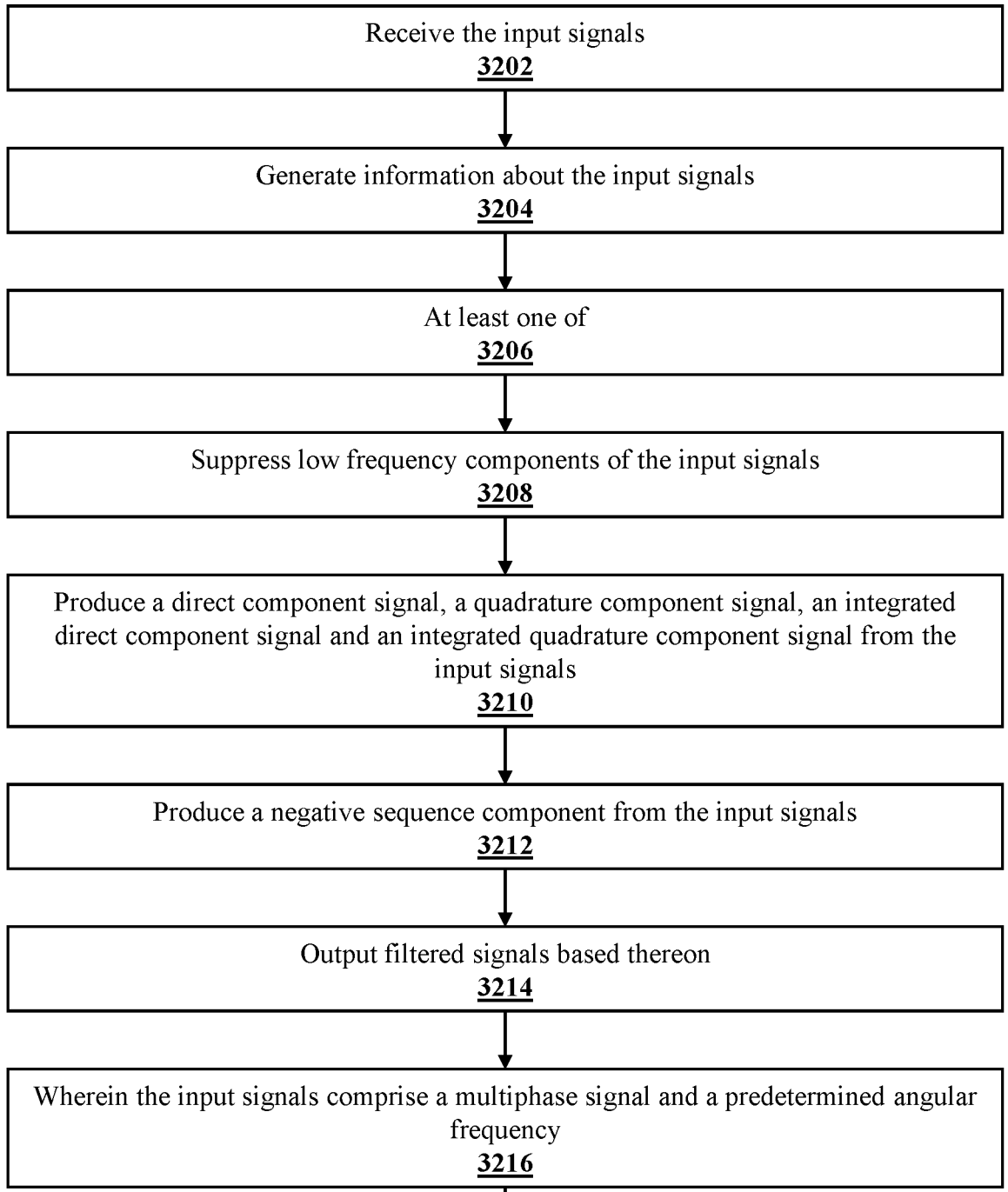
FIG. 32 is a flow chart of a method of filtering an input signal in accordance with the present disclosure.
Figure 32B:
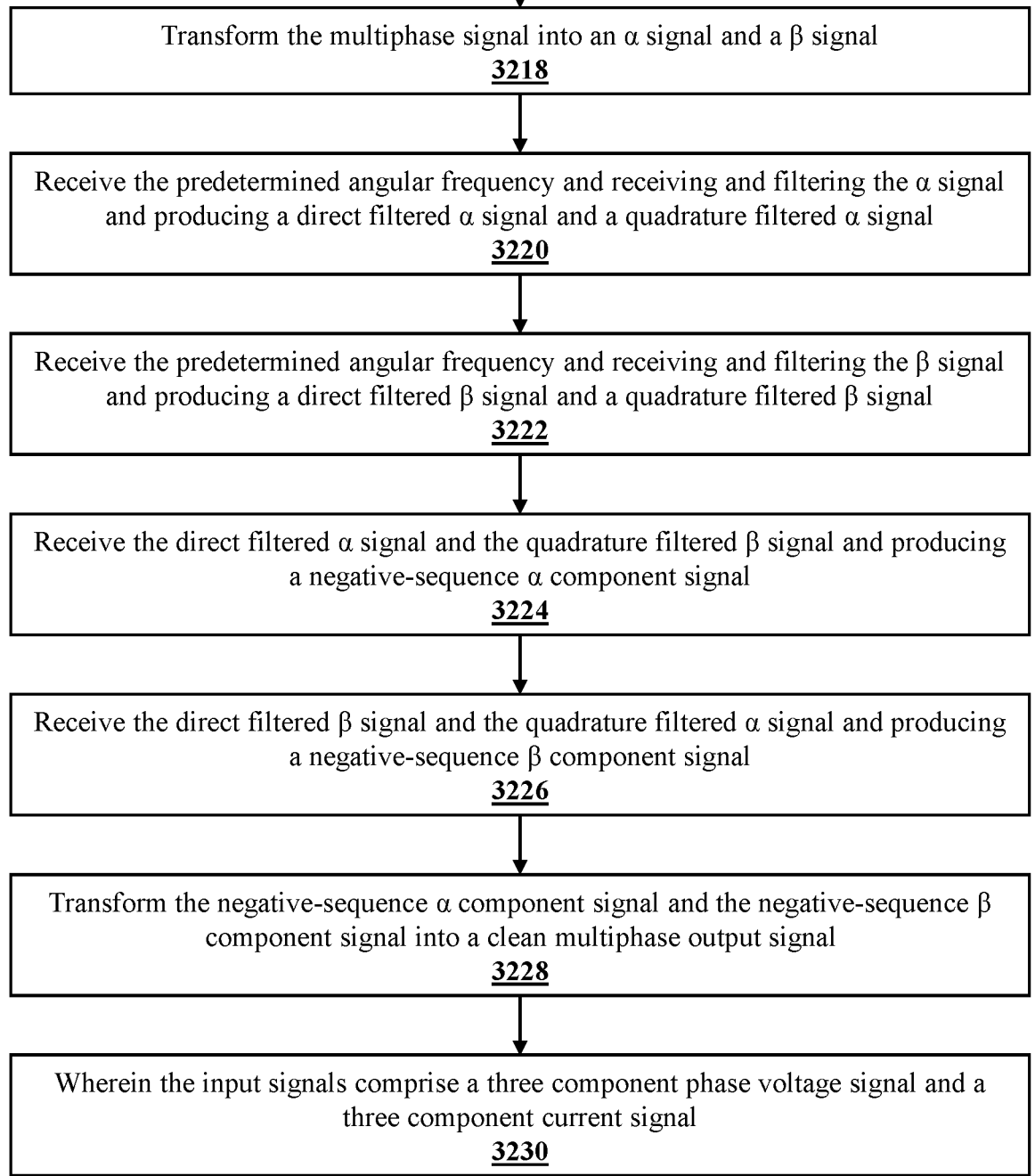
Figure 32C:
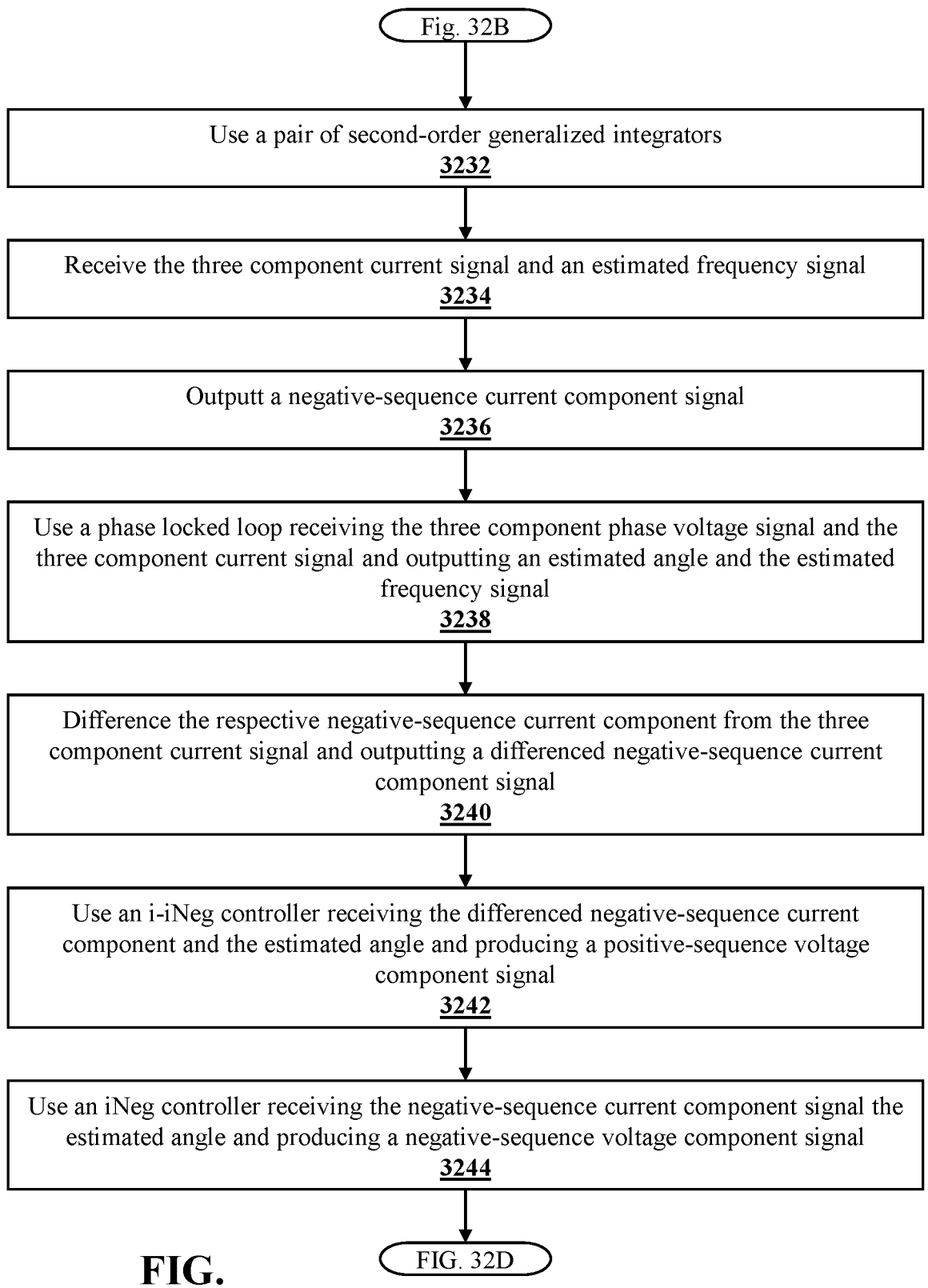
Figure 33:
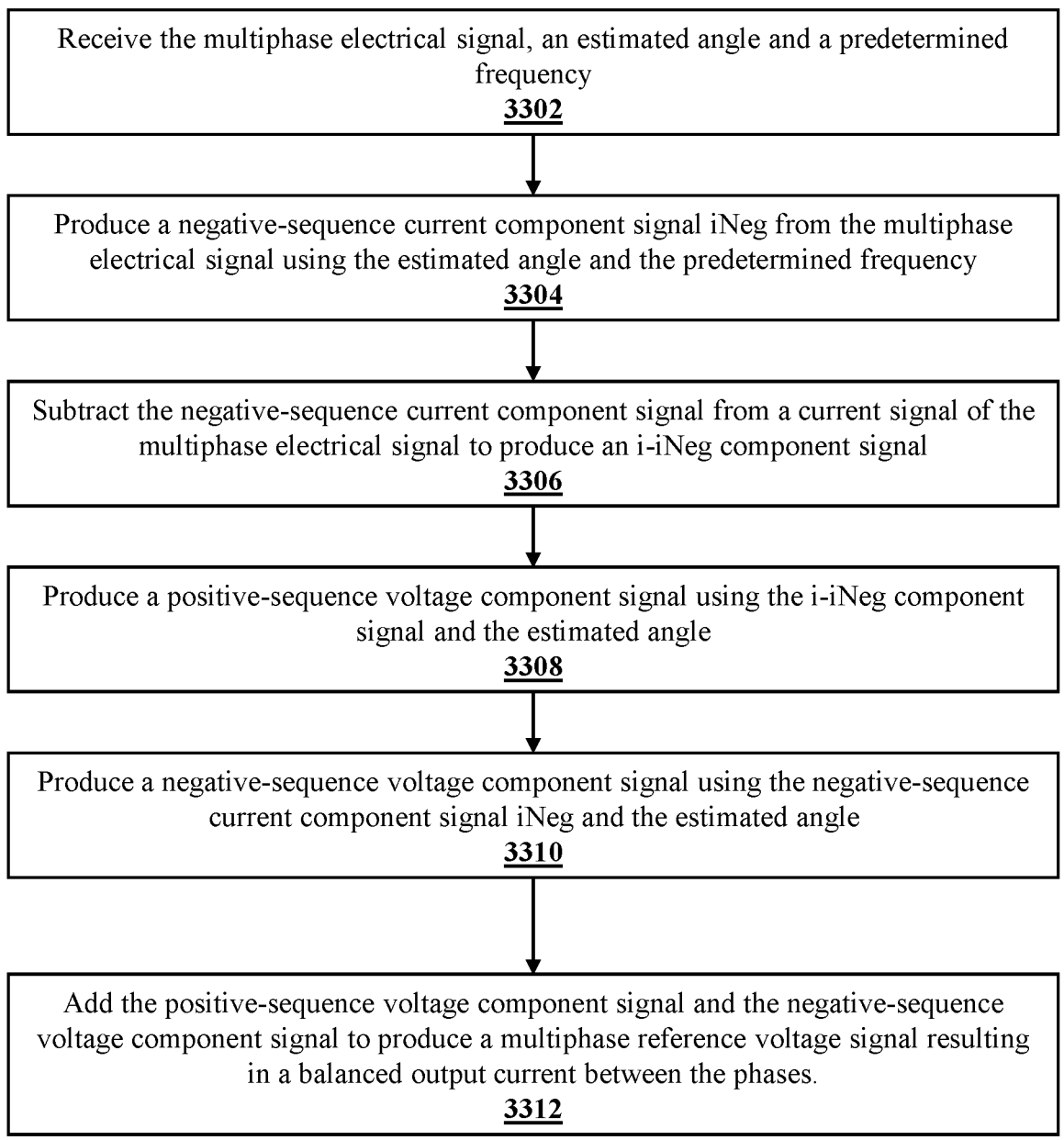
FIG. 33 is a flow chart of a method of reducing a current imbalance between phases of a multiphase electrical signal in accordance with the present disclosure.

Referring now to FIG. 31, there is shown a scalar (V/f) control system 3100 for use with an induction motor to scalar control in a manner that balances the motor currents. In contrast to embodiments described herein before, a PLL and a positive-sequence current controller are not required in this particular embodiment scalar control system 3100, as the predetermined frequency and the angle of the voltages can be pre-programmed in the drive. In order to suppress any imbalances on the three component current, DSOGI 3101 and negative-sequence current controller 3102 are used. Scalar control system 3100 further comprises any known V/f controller 3103 that supplies normal demand voltage output 3104 v, the three component phase voltage signal. The three-phase output 3105 of negative-sequence current controller 3102 is added to the respective normal demand voltage outputs v 3104 by calculator 3106. The summed voltages are passed as demand voltages 3107 vRef to the modulator 3108. V/f controller 3103 generates a continually increasing or decreasing angle 3109 θ (between zero to 360 degrees) according to a set frequency f and time t wherein θ=2 πf t. The rate of change of angle is the electrical frequency. It will be appreciated by those skilled in the art that in a two-pole motor, the electrical frequency is equal to the synchronous (i.e. assuming slip is equal to zero) shaft rotation frequency, but in higher pole count motors the electrical frequency is the number of pole pairs times the shaft rotation frequency. This relationship is valid through the present disclosure wherever the PLLs are generating the electrical angle and the estimated frequency signal. Because, as in FIG. 28, both d and q current references are normally zero for negative-sequence controller 3102 iNeg controller, it only requires that the angle input θ increases as θ=2 πf t, and the controller does not require that the angle input θ has any fixed relationship to the rotor flux angle. In particular, there is no need to estimate or control the rotor position, which in any case is not possible for a scalar controller as it normally does not have the necessary motor model and observer found in vector controls. Importantly, it has been discovered that the angle input θ of the negative-sequence controller can simply be the programmed angle 3109 of V/f control block 3103. In certain embodiments of scalar control system 3100, it may be preferable that DSOGI 3101 comprises two mSOGIs and which control system, as should be appreciated by those skilled in the art, has no observer. The foregoing disclosure relative to d and q current references normally being zero and their effect on the relationship of θ with the rotor flux angle apply whenever the negative-sequence current controller is used because the references 2801 and 2802 are zero, essentially yielding an equivalent structure.

As set forth herein above, embodiments of the present disclosure are useful in a variety of industrial applications. For instance, there exists many tens of thousands of oilfield variable speed drives that are of the scalar type operating submersible pump induction motors over long cables. Embodiments of the present disclosure can be realized on existing controllers by introducing a modification to their logic or firmware wherein they can be upgraded to improve the performance and reliability of existing motors. Embodiments of the present disclosure can also be incorporated in new drive designs. Because of the ability of embodiments of the present disclosure to handle imbalances in the input current, in many cases a flat cable can be used instead of round cable, improving mechanical clearances in the borehole and so reducing the chance of damage during installation.

It will be apparent that the structures and methods disclosed herein can be implemented as integrated circuits, in programmable logic, or in high speed processors. Particular applications of certain embodiment of the present disclosure extend to modules that can be used to upgrade existing equipment. An example would be to provide an emulation of an optical shaft encoder by converting phase and frequency to quadrature pulse streams. Other applications include grid monitoring equipment for the accurate measurement of rate of change of frequency (ROCOF) which is an important protection mechanism and further for power quality analysis.

While the disclosures in the present disclosure have focused on mSOGI-2QSG structures, it will be appreciated that without departing from the scope of the present disclosure, any structure capable of extracting clean, DC free and balanced signals, their integrals and their time quadratures from input signals may be applied as shown herein to the generation of balanced currents for motor control and grid injection type applications using power electronics inverter on unbalanced loads.

REFERENCES

[1] M. Ciobotaru, R. Teodorescu, F. Blaabjerg. A new single phase PLL structure based on second order generalized integrator. *IEEE Power Electronics Specialists Conference*, pp. 1-6, 2006.

[2] M. Karimi-Ghartemani, S. A. Khajehoddin, P. K. Jain, A. Bakhshai and M. Mojiri, "Addressing DC Component in PLL and Notch Filter Algorithms," in *IEEE Transactions on Power Electronics*, vol. 27, no. 1, pp. 78-86, January 2012.

[3] J. Li, J. Zhao, J. Wu and P. p. Xu, "Improved dual second-order generalized integrator PLL for grid synchronization under non-ideal grid voltages including DC offset," 2014 *IEEE Energy Conversion Congress and Exposition (ECCE)*, Pittsburgh, Pa., 2014, pp. 136-141.

[4] M. Ciobotaru, R. Teodorescu and V. G. Agelidis, "Offset rejection for PLL based synchronization in grid-connected converters," *Applied Power Electronics Conference and Exposition, 2008. APEC 2008. Twenty-Third Annual IEEE*, Austin, Tex., 2008, pp. 1611-1617.

[5] K. Możdżyński, "Simple digital integration algorithm with saturation and drift elimination based Second-Order Generalized Integrator," 2015 *9th International Conference on Compatibility and Power Electronics (CPE)*, Costa da Caparica, 2015, pp. 312-316.

[6] P. Rodriguez, J. Pou, J. Bergas, I. Candela, R. Burgos and D. Boroyevic,

"Double Synchronous Reference Frame PLL for Power Converters Control," 2005 *IEEE 36th Power Electronics Specialists Conference*, Recife, 2005, pp. 1415-1421.

[7] M. Reyes, P. Rodriguez, S. Vazquez, A. Luna, R. Teodorescu and J. M. Carrasco, "Enhanced Decoupled Double Synchronous Reference Frame Current Controller for Unbalanced Grid-Voltage Conditions," in IEEE Transactions on Power Electronics, vol. 27, no. 9, pp. 3934-3943, September 2012.

[8] D. Yazdani, M. Mojiri, A. Bakhshai and G. Joós, "A Fast and Accurate Synchronization Technique for Extraction of Symmetrical Components," in *IEEE Transactions on Power Electronics*, vol. 24, no. 3, pp. 674-684, March 2009.

[9] P. Rodriguez, A. Luna, I. Candela, R. Mujal, R. Teodorescu and F. Blaabjerg, "Multiresonant Frequency-Locked Loop for Grid Synchronization of Power Converters Under Distorted Grid Conditions," in *IEEE Transactions on Industrial Electronics*, vol. 58, no. 1, pp. 127-138, January 2011.

[10] R. Zhao, Z. Xin, P. C. Loh and F. Blaabjerg, "A novel flux estimator based on SOGI with FLL for induction machine drives," 2016 *IEEE Applied Power Electronics Conference and Exposition (APEC)*, Long Beach, C A, 2016, pp. 1995-2002.

What is claimed is:

1. A system for electrical applications comprising:
   at least one second-order generalized integrator based adaptive filter comprising a structure:
   adapted to receive input signals and to generate information about the input signals and at least one of:
   suppressing low frequency components of the input signals; and
   producing a direct component signal, a quadrature component signal, an integrated direct component signal and an integrated quadrature component signal from the input signals; and
   producing a negative-sequence component signal from the input signal; and
   adapted to output filtered signals based thereon;
   wherein the at least one second-order generalized integrator based adaptive filter comprises a modified second-order generalized integrator dual quadrature signal generator adapted to suppress the low frequency components of the input signals and wherein the filtered output signals comprise the direct component signal, the quadrature component signal, the integrated direct component signal and the integrated quadrature component signal all having the suppressed low frequency components;
   wherein the input signals comprise a multiphase signal and a predetermined angular frequency;
   a first transformation processor adapted to transform the multiphase signal into an α signal and a β signal;
   the at least one second-order generalized integrator comprises:
   a first modified second-order generalized integrator dual quadrature signal generator adapted to receive the predetermined angular frequency and to receive and filter the α signal and to produce a direct filtered integral α signal and a quadrature filtered integral α signal;
   a second modified second-order generalized integrator dual quadrature signal generator adapted to receive the predetermined angular frequency and to receive and filter the β signal and to produce a direct filtered integral β signal and a quadrature filtered integral β signal;
   a first differencing calculator adapted to receive the direct filtered integral α signal and the quadrature filtered integral β signal and to produce a positive-sequence α integral component signal;
   a first summing calculator adapted to receive the direct filtered integral β signal and the quadrature filtered integral α signal and to produce a positive-sequence β integral component signal; and
   a second transformation processor adapted to transform the negative-sequence α integral component signal and the negative-sequence β integral component signal into a clean multiphase output signal.

2. The system of claim 1, wherein the input signals comprise the multiphase signal and the predetermined angular frequency, the system further comprising:
   a first transformation processor adapted to transform the multiphase signal into the α signal and the β signal;
   the at least one second-order generalized integrator based adaptive filter comprises:
   a first second-order generalized integrator adapted to receive the predetermined angular frequency and to receive and filter the α signal and to produce a direct filtered α signal and a quadrature filtered α signal;
   a second second-order generalized integrator adapted to receive the predetermined angular frequency and to receive and filter the β signal and to produce a direct filtered β signal and a quadrature filtered β signal;
   the system further comprising:
   a first calculator adapted to receive the direct filtered α signal and the quadrature filtered β signal and to produce a positive-sequence α component signal;
   a second calculator adapted to receive the direct filtered β signal and the quadrature filtered α signal and to produce a positive-sequence β component signal; and
   a second transformation processor adapted to transform the positive-sequence α component signal and the positive-sequence β component signal into a clean multiphase positive-sequence output signal.

3. The system of claim 2, further comprising:
   a second summing calculator adapted to receive the direct filtered α signal and the quadrature filtered β signal and to produce a negative-sequence α component signal;
   a second differencing calculator adapted to receive the direct filtered β signal and the quadrature filtered α signal and to produce a negative-sequence β component signal; and
   a third transformation processor adapted to transform the negative-sequence α component signal and the negative-sequence β component signal into a signal into a clean multiphase negative-sequence output signal.

4. The system of claim 2 wherein the input signals include any of imbalances, ripples, harmonics and DC components and wherein at least one of the imbalances, ripples, harmonics and DC components is attenuated in the clean multiphase positive-sequence output signal.

5. A system for electrical applications comprising:
   at least one second-order generalized integrator based adaptive filter comprising a structure:
   adapted to receive input signals and to generate information about the input signals and at least one of:
   suppressing low frequency components of the input signals; and
   producing a direct component signal, a quadrature component signal, an integrated direct component signal and an integrated quadrature component signal from the input signals; and
   producing a negative-sequence component signal from the input signal;; and
   adapted to output filtered signals based thereon;

wherein the input signals comprise a three component phase voltage signal and a three component reactive phase flux drop signal;
the at least one second-order generalized integrator based adaptive filter comprises:
a first pair of second-order generalized integrators adapted to receive an estimated frequency signal and to receive, integrate and filter the three component phase voltage signal and to output a filtered flux signal;
a second pair of second-order generalized integrators adapted to receive an estimated frequency signal and to receive and filter the three component reactive phase flux drop signal and to output a filtered reactive phase flux drop signal;
a calculator adapted to produce a difference between the filtered flux signal and the filtered reactive phase flux drop signal and to output an estimated rotor flux signal; and
an observer adapted to receive the estimated rotor flux signal and to output an estimated rotor angle and the estimated frequency signal.

6. The system of claim 5, further comprising a low pass filter adapted to receive the estimated frequency signal and to output a filtered estimated frequency signal to the first pair of second-order generalized integrators and the second pairs of second-order generalized integrators.

7. The system of claim 6, further comprising:
a stator inductance L, a rotor inductance (Lr) and a magnetizing inductance (Lm);
a leakage coefficient of $1-L_m^2/(L*Lr)$ applied to the three component reactive phase flux drop signal; and
a gain device positioned between the calculator and the observer adapted to receive the difference between the filtered flux signal and the filtered reactive phase flux drop signal and to apply a gain factor of Lr/Lm to the difference between the filtered flux signal and the filtered reactive phase flux drop signal and to output an estimated rotor flux signal to the observer.

8. A system for electrical applications comprising:
at least one second-order generalized integrator based adaptive filter comprising a structure:
adapted to receive input signals and to generate information about the input signals and at least one of:
suppressing low frequency components of the input signals; and
producing a direct component signal, a quadrature component signal, an integrated direct component signal and an integrated quadrature component signal from the input signals; and
producing a negative-sequence component signal from the input signal; and
adapted to output filtered signals based thereon;
wherein the input signals comprise a three component phase voltage signal and a three component current signal;
the at least one second-order generalized integrator based adaptive filter comprises:
a pair of second-order generalized integrators adapted to receive the three component current signal and an estimated frequency signal and to output a negative-sequence current component signal;
a phase locked loop adapted to receive the three component phase voltage signal and the three component current signal and to output an estimated angle and the estimated frequency signal;
a calculator adapted to difference the respective negative-sequence current component from the three component current signal and to output a differenced negative-sequence current component signal;
an i-iNeg controller adapted to receive the differenced negative-sequence current component and the estimated angle and to produce a positive-sequence voltage component signal;
an iNeg controller adapted to receive the negative-sequence current component signal the estimated angle and to produce a negative-sequence voltage component signal; and
a calculator adapted to receive the positive-sequence voltage component signal and the negative-sequence voltage component signal and to produce a reference voltage.

9. The system of claim 8, wherein:
the i-iNeg controller comprises:
a first transformation processor adapted to receive the differenced negative-sequence current component signal and the estimated angle and to output a direct current component signal and a quadrature current component signal; and
a first proportional integral controller adapted to receive the direct current component signal and a direct current reference signal and to produce a direct voltage component signal;
a second proportional integral controller adapted to receive the quadrature current component signal and a quadrature current reference signal and to produce a quadrature voltage component signal; and
a second transformation processor adapted to receive the direct voltage component signal and the quadrature voltage component signal and to produce the positive-sequence voltage component signal; and
the iNeg controller comprises:
a first transformation processor adapted to receive the negative-sequence current component signal and the estimated angle and to output a direct current component signal and a quadrature current component signal;
a first proportional integral controller adapted to receive the direct current component signal and a zero reference signal and to produce a direct voltage component signal;
a second proportional integral controller adapted to receive the quadrature current component signal and a zero reference signal and to produce a quadrature voltage component signal; and
a second transformation processor adapted to receive the direct voltage component signal and the quadrature voltage component signal and to produce the negative-sequence voltage component signal.

10. A system for electrical applications comprising:
at least one second-order generalized integrator based adaptive filter comprising a structure:
adapted to receive input signals and to generate information about the input signals and at least one of:
suppressing low frequency components of the input signals; and
producing a direct component signal, a quadrature component signal, an integrated direct component signal and an integrated quadrature component signal from the input signals; and
producing a negative-sequence component signal from the input signal; and
adapted to produce a negative-sequence component signal from the input signal; and adapted to output filtered signals based thereon;

the input signals comprise a three component phase voltage signal and a three component current signal;

the at least one second-order generalized integrator based adaptive filter comprises a second-order generalized integrator dual quadrature signal generator adapted to receive and filter the three component current signal and the three component phase voltage signal and to output a negative-sequence current component signal and an estimated rotor angle;

a differencing calculator adapted to difference the negative-sequence current component signal from the three component current signal and to output a differenced negative-sequence current component signal;

an i-iNeg controller adapted to receive the differenced negative-sequence current component and the estimated rotor angle and to produce a positive-sequence voltage component signal;

an iNeg controller adapted to receive the negative-sequence current component signal the estimated rotor angle and to produce a negative-sequence voltage component signal; and a summing calculator adapted to receive the positive-sequence voltage component signal and the negative-sequence voltage component signal and to produce a reference voltage signal.

11. The system of claim 10, further comprising a synchronous motor and wherein the reference voltage signal is used to control at least one of a predetermined speed and a predetermined torque of the synchronous motor.

12. The system of claim 10, wherein:

the second-order generalized integrator dual quadrature signal generator is further adapted to receive an estimated rotor flux signal and an estimated frequency signal; and the i-iNeg controller is further adapted to receive the estimated rotor flux signal and the estimated frequency signal and to produce the positive-sequence voltage component signal using the estimated rotor flux signal and the estimated frequency signal.

13. The system of claim 12, further comprising one of a synchronous motor or an asynchronous motor and wherein the reference voltage signal is used to control at least one of a predetermined speed or a predetermined torque of the synchronous motor or the synchronous motor.

14. The system of claim 12, wherein the second-order generalized integrator dual quadrature signal generator is further comprises a phase lock loop.

15. A system for electrical applications comprising:

at least one second-order generalized integrator based adaptive filter comprising a structure:

adapted to receive input signals and to generate information about the input signals and at least one of:

suppressing low frequency components of the input signals; and producing a direct component signal, a quadrature component signal, an integrated direct component signal and an integrated quadrature component signal from the input signals; and producing a negative-sequence component signal from the input signal; and adapted to produce a negative-sequence component signal from the input signal; and adapted to output filtered signals based thereon;

wherein the input signals comprise at least one of a three component phase voltage signal and a three component current signal;

the at least one second-order generalized integrator based adaptive filter comprises:

a second-order generalized integrator dual quadrature signal generator adapted to receive and filter the three component current signal and an estimated frequency signal and to output a negative-sequence current component signal;

a V/f controller adapted to output a three component phase voltage signal, a programmed angle and a programmed frequency signal;

an iNeg controller adapted to receive the negative-sequence current component signal the programmed angle and to produce a negative-sequence voltage component signal; and a summing calculator adapted to receive the three component phase voltage signal and the negative-sequence voltage component signal and to produce a reference voltage signal.

16. The system of claim 15, further comprising an asynchronous motor and wherein the reference voltage signal is used to control at least one of a speed and a torque of the asynchronous motor.

17. The system of claim 1, wherein input signals comprise any one of voltage signals and current signals.

18. The system of claim 1, wherein the input signals are received from a power grid or a power generating device.

19. A method of filtering an input signal comprising:

receiving the input signals;

generating information about the input signals;

and at least one of:

suppressing low frequency components of the input signals; and producing a direct component signal, a quadrature component signal, an integrated direct component signal and an integrated quadrature component signal from the input signals; and producing a negative sequence component from the input signals; and outputting filtered signals based thereon;

wherein the input signals comprise a multiphase signal and a predetermined angular frequency;

transforming the multiphase signal into an α signal and a β signal;

receiving the predetermined angular frequency and receiving and filtering the α signal and producing a direct filtered α signal and a quadrature filtered α signal;

receiving the predetermined angular frequency and receiving and filtering the β signal and producing a direct filtered β signal and a quadrature filtered β signal;

receiving the direct filtered α signal and the quadrature filtered β signal and producing a negative-sequence α component signal;

receiving the direct filtered β signal and the quadrature filtered α signal and producing a negative-sequence β component signal; and transforming the negative-sequence α component signal and the negative-sequence β component signal into a clean multiphase output signal;

wherein the input signals comprise a three component phase voltage signal and a three component current signal;

using a pair of second-order generalized integrators:
  receiving the three component current signal and an estimated frequency signal; and
  outputting a negative-sequence current component signal;
using a phase locked loop receiving the three component phase voltage signal and the three component current signal and outputting an estimated angle and the estimated frequency signal;
differencing the respective negative-sequence current component from the three component current signal and outputting a differenced negative-sequence current component signal;
using an i-iNeg controller receiving the differenced negative-sequence current component and the estimated angle and producing a positive-sequence voltage component signal;
using an iNeg controller receiving the negative-sequence current component signal the estimated angle and producing a negative-sequence voltage component signal; and
producing a reference voltage from the positive-sequence voltage component signal and the negative-sequence voltage component signal.

20. The method of claim 19 wherein producing the reference voltage includes producing output signals and removing a current imbalance.

21. A method of reducing a current imbalance between phases of a multiphase electrical signal comprising:
  receiving the multiphase electrical signal, an estimated angle and a predetermined frequency;
  producing a negative-sequence current component signal iNeg from the multiphase electrical signal using the estimated angle and the predetermined frequency;
  subtracting the negative-sequence current component signal from a current signal of the multiphase electrical signal to produce an i-iNeg component signal;
  producing a positive-sequence voltage component signal using the i-iNeg component signal and the estimated angle;
  producing a negative-sequence voltage component signal using the negative-sequence current component signal iNeg and the estimated angle; and
  adding the positive-sequence voltage component signal and the negative-sequence voltage component signal to produce a multiphase reference voltage signal resulting in a balanced output current between the phases.

* * * * *